(12) United States Patent
Ono et al.

(10) Patent No.: US 11,756,820 B2
(45) Date of Patent: Sep. 12, 2023

(54) ELECTROSTATIC CHUCK AND SEMICONDUCTOR MANUFACTURING APPARATUS

(71) Applicant: TOTO LTD., Kitakyushu (JP)

(72) Inventors: Akihito Ono, Kitakyushu (JP); Jumpei Uefuji, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 175 days.

(21) Appl. No.: 17/469,159

(22) Filed: Sep. 8, 2021

(65) Prior Publication Data
US 2022/0102181 A1    Mar. 31, 2022

(30) Foreign Application Priority Data

Sep. 28, 2020   (JP) .................................. 2020-162186
Mar. 24, 2021   (JP) .................................. 2021-050164

(51) Int. Cl.
| | | |
|---|---|---|
| H01L 21/683 | (2006.01) | |
| H01T 23/00 | (2006.01) | |
| H01J 37/32 | (2006.01) | |
| H05B 3/28 | (2006.01) | |
| H05B 1/02 | (2006.01) | |

(52) U.S. Cl.
CPC .... *H01L 21/6833* (2013.01); *H01J 37/32724* (2013.01); *H05B 3/283* (2013.01); *H05B 1/0233* (2013.01); *H05B 2203/005* (2013.01); *H05B 2203/008* (2013.01); *H05B 2203/016* (2013.01)

(58) Field of Classification Search
CPC . H01L 21/6833; H01J 37/32724; H05B 3/283
USPC ................................................ 361/234, 217
See application file for complete search history.

(56) References Cited

U.S. PATENT DOCUMENTS

| | | |
|---|---|---|
| 2016/0307787 A1 | 10/2016 | Uemura et al. |
| 2018/0286732 A1 | 10/2018 | Uefuji et al. |
| 2019/0088517 A1 | 3/2019 | Kosakai et al. |
| 2019/0148204 A1 | 5/2019 | Yamaguchi et al. |

(Continued)

FOREIGN PATENT DOCUMENTS

| | | |
|---|---|---|
| JP | 2002-329567 A | 11/2002 |
| JP | 2016-207777 A | 12/2016 |
| JP | 2017-201669 A | 11/2017 |

(Continued)

*Primary Examiner* — Jared Fureman
*Assistant Examiner* — Lucy M Thomas
(74) *Attorney, Agent, or Firm* — Carrier, Shende & Associates P.C.; Joseph P. Carrier; Fulchand P. Shende

(57) ABSTRACT

An electrostatic chuck includes a ceramic dielectric substrate; a base plate; and a heater unit which heats the ceramic dielectric substrate. The heater unit includes first and second heater elements. The second heater element has a plurality of main zones separated from each other in a radial direction. The first heater element has a plurality of sub-zones separated from each other. A number of the sub-zones is larger than a number of the main zones. The main zones include a first main zone. The first main zone has a main heater line and a first main power feeding portion. The sub-zones include a first sub-zone overlapping the first main zone. The first sub-zone has a central region and an outer peripheral region. The first main power feeding portion is provided at a position where the first main power feeding portion overlaps the central region.

15 Claims, 27 Drawing Sheets

(56) References Cited

U.S. PATENT DOCUMENTS

2021/0090930 A1\* 3/2021 Miwa .................... H01L 21/683

FOREIGN PATENT DOCUMENTS

| | | |
|---|---|---|
| JP | 2018-022871 A | 2/2018 |
| JP | 2018-120910 A | 8/2018 |
| JP | 2018-142488 A | 9/2018 |
| JP | 2018-170508 A | 11/2018 |
| WO | 2016/080502 A1 | 5/2016 |

\* cited by examiner

ELECTROSTATIC CHUCK AND SEMICONDUCTOR MANUFACTURING APPARATUS

CROSS-REFERENCE TO RELATED APPLICATIONS

This application is based upon and claims the benefit of priority from Japanese Patent Application No. 2020-162186, filed on Sep. 28, 2020, and No. 2021-050164, filed on Mar. 24, 2021; the entire contents of which are incorporated herein by reference.

FIELD

Embodiments described herein relate generally to an electrostatic chuck and a semiconductor manufacturing apparatus.

BACKGROUND

In a plasma processing chamber where etching, chemical vapor deposition (CVD), sputtering, ion implantation, ashing, or the like is performed, an electrostatic chuck is used as a member for clamping and holding a process object such as a semiconductor wafer or a glass substrate. The electrostatic chuck applies an electrostatic clamping power to built-in electrodes and clamps a substrate such as a silicon wafer by an electrostatic force.

In recent years, IC chips including semiconductor elements such as transistors have been required to be miniaturized and improved in processing speed. Along with this requirement, in forming the semiconductor element on a wafer, it is required to improve processing accuracy of etching or the like. The processing accuracy of etching indicates whether or not a pattern having a width and depth as designed can be formed by processing a wafer. By increasing the processing accuracy of etching or the like, the semiconductor element can be miniaturized, and the integration density can be increased. That is, by increasing the processing accuracy, it is possible to reduce the size of the chip and to increase the speed of the chip.

It is known that a processing accuracy of etching or the like depends on the temperature of a wafer during processing. Therefore, in a substrate processing apparatus having an electrostatic chuck, it is required to control an in-plane temperature distribution of the wafer during the processing in order to allow an etching rate to be uniform. As a method of controlling the in-plane temperature distribution of the wafer, a method of using an electrostatic chuck having an embedded heater (heating element) is known.

In particular, in recent years, along with the miniaturization of semiconductor elements, faster heating and more strict control of in-plane temperature distribution have been required, and as a method for implementing this, a two-layer structure of a main heater and a sub-heater as a heater is considered (WO 2016/080502).

However, it is not enough to simply allow the heater to have a two-layer structure of a main heater and a sub heater, and further improvement of uniformity of in-plane temperature distribution of the wafer is required.

SUMMARY

According to the embodiment, an electrostatic chuck includes a ceramic dielectric substrate, a base plate, and a heater unit. The ceramic dielectric substrate has a first major surface and a second major surface. The first major surface is configured to have a process object mounted thereon. The second major surface is on a side opposite to the first major surface. The base plate supports the ceramic dielectric substrate. The heater unit heats the ceramic dielectric substrate. The heater unit includes a first heater element and a second heater element. The second heater element has a plurality of main zones separated from each other in a radial direction. The first heater element has a plurality of sub-zones separated from each other. A number of the sub-zones is larger than a number of the main zones. The main zones include a first main zone. The first main zone has a main heater line generating heat by allowing a current to flow and a first main power feeding portion feeding a power to the main heater line. The sub-zones include a first sub-zone overlapping the first main zone in a Z-direction perpendicular to the first major surface. The first sub-zone has a central region located centrally in the first sub-zone and an outer peripheral region located outside the central region when viewed along the Z-direction. The first main power feeding portion is provided at a position where the first main power feeding portion overlaps the central region in the Z-direction.

DETAILED DESCRIPTION

Figure 1:
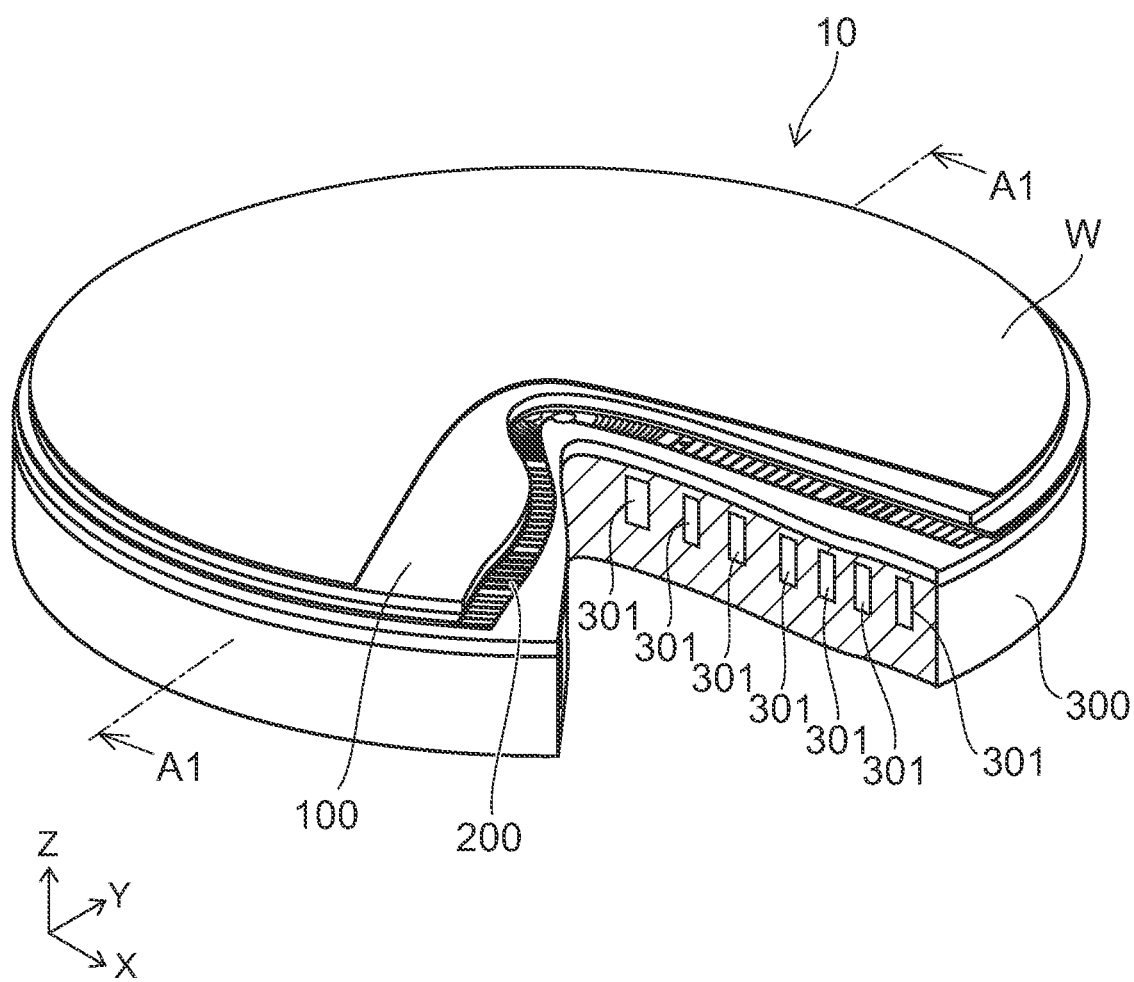
FIG. 1 is a perspective view schematically illustrating an electrostatic chuck according to an embodiment.

According to a first invention, there is provided an electrostatic chuck including: a ceramic dielectric substrate having a first major surface configured to have a process object mounted thereon and a second major surface opposite to the first major surface; a base plate supporting the ceramic dielectric substrate; and a heater unit which heats the ceramic dielectric substrate, wherein the heater unit includes a first heater element and a second heater element, the second heater element having a plurality of main zones separated from each other in a radial direction, the first heater element having a plurality of sub-zones separated from each other, a number of the sub-zones being larger than a number of the main zones, the main zones including a first main zone, the first main zone having a main heater line generating heat by allowing a current to flow and a first main power feeding portion feeding a power to the main heater line, the sub-zones including a first sub-zone overlapping the first main zone in a Z-direction perpendicular to the first major surface, the first sub-zone having a central region located centrally in the first sub-zone and an outer peripheral region located outside the central region when viewed along the Z-direction, and the first main power feeding portion being provided at a position where the first main power feeding portion overlaps the central region in the Z-direction.

According to the electrostatic chuck, the first main power feeding portion of which temperature is likely to be lower than that of the main heater line when the second heater element is heated is provided at a position where the first main power feeding portion overlaps the central region of the first sub-zone of which temperature is likely to be higher than that of the outer peripheral region of the first sub-zone in the Z-direction, so that the uniformity of the in-plane temperature distribution of the entire heater unit can be improved. Accordingly, the uniformity of the in-plane temperature distribution of the process object can be improved.

In a second invention, in the electrostatic chuck according to the first invention, the first sub-zone has a sub-heater line generating heat by allowing a current to flow, a first sub-power feeding portion feeding a power to the sub-heater line, and a second sub-power feeding portion feeding a power to the sub-heater line, and when viewed along the Z-direction, a sum of an area of the first sub-power feeding portion overlapping the central region, an area of the second sub-power feeding portion overlapping the central region, and an area of the first main power feeding portion overlapping the central region is larger than a sum of an area of the first sub-power feeding portion overlapping the outer peripheral region, an area of the second sub-power feeding portion overlapping the outer peripheral region, and an area of the first main power feeding portion overlapping the outer peripheral region.

According to the electrostatic chuck, a total area of the power feeding portions overlapping the central region is allowed to be larger than a total area of the power feeding portions overlapping the outer peripheral region, so that the power feeding portion of which temperature is likely to be low can be brought to be closer to the central region of which temperature is relatively high in the zone. Accordingly, the uniformity of the in-plane temperature distribution of the entire heater unit can be further improved.

In a third invention, in the electrostatic chuck according to the first or second invention, the first sub-zone has a sub-heater line generating heat by allowing the current to flow, a first sub-power feeding portion feeding a power to the sub-heater line, and a second sub-power feeding portion feeding a power to the sub-heater line, and at least one of the first sub-power feeding portion and the second sub-power feeding portion is provided in the central region.

According to the electrostatic chuck, the first sub-power feeding portion and the second sub-power feeding portion of which temperature is likely to be lower than that of the sub-heater line when the first heater element is heated are provided in the central region of the first sub-zone of which the temperature is likely to be higher than that of the outer peripheral region of the first sub-zone, so that the uniformity of the in-plane temperature distribution of the first sub-zone can be improved. Accordingly, the uniformity of the in-plane temperature distribution of the entire heater unit can be further improved.

In a fourth invention, in the electrostatic chuck according to the third invention, the first sub-power feeding portion and the second sub-power feeding portion are provided in the central region.

According to the electrostatic chuck, both the first sub-power feeding portion and the second sub-power feeding portion are provided in the central region of the first sub-zone, so that the uniformity of the in-plane temperature distribution of the first sub-zone can be further improved. Accordingly, the uniformity of the in-plane temperature distribution of the entire heater unit can be further improved.

In a fifth invention, in the electrostatic chuck according to any one of the first to fourth inventions, the first sub-zone has a sub-heater line generating heat by allowing the current to flow, a first sub-power feeding portion feeding a power to the sub-heater line, and a second sub-power feeding portion feeding a power to the sub-heater line, and the first main power feeding portion is provided at a position where the first main power feeding portion overlaps the sub-heater line in the Z-direction.

Since the first main power feeding portion itself does not generate heat, the temperature of the first main power feeding portion is lower than that of the main heater line. According to the electrostatic chuck, the first main power feeding portion is provided at a position where the first main power feeding portion overlaps the sub-heater line in the Z-direction, so that the low temperature of the first main power feeding portion can be supplemented by the heat of the sub-heater line, and the uniformity of the in-plane temperature distribution of the entire heater unit can be further improved.

In a sixth invention, in the electrostatic chuck according to any one of the first to fifth inventions, the first main zone further has a lift pin hole provided with a lift pin for supporting the process object being able to passing through the lift pin hole, and the lift pin hole is provided at a position where the lift pin hole overlaps the central region in the Z-direction.

According to the electrostatic chuck, the lift pin hole of which temperature is likely to be lower than those of other portions because the main heater line is not provided when the second heater element is heated is allowed to be provided at a position where the lift pin hole overlaps the central region of the first sub-zone of which the temperature is likely to be higher than that of the outer peripheral region of the first sub-zone in the Z-direction, so that the uniformity of the in-plane temperature distribution of the entire heater unit can be improved.

In a seventh invention, the electrostatic chuck according to any one of the first to sixth inventions further includes a clamping electrode provided inside the ceramic dielectric substrate, in which the first main zone further has a clamping electrode terminal hole provided with a clamping electrode terminal for supplying a current to the clamping electrode being able to pass through the clamping electrode terminal hole, and the clamping electrode terminal hole is provided at a position where the clamping electrode terminal hole overlaps the central region in the Z-direction.

According to the electrostatic chuck, the clamping electrode terminal hole of which temperature is likely to be lower than those of other portions because the main heater line is not provided when the second heater element is heated is provided at a position where the clamping electrode terminal hole overlaps the central region of the first sub-zone of which temperature is likely to be higher than that of the outer peripheral region of the first sub-zone in the Z-direction, so that the uniformity of the in-plane temperature distribution of the entire heater unit can be improved.

In an eighth invention, in the electrostatic chuck according to any one of the first to seventh inventions, the first main zone further has a cooling gas hole provided with a cooling gas for cooling the process object being able to pass though the cooling gas hole, and the cooling gas hole is provided at a position where the cooling gas hole overlaps the central region in the Z-direction.

According to the electrostatic chuck, the cooling gas hole of which temperature is likely to be lower than those of other portions because the main heater line is not provided when the second heater element is heated is provided at a position where the cooling gas hole overlaps the central region of the first sub-zone of which temperature is likely to be higher than that of the outer peripheral region of the first sub-zone in the Z-direction, so that the uniformity of the in-plane temperature distribution of the entire heater unit can be improved.

In a ninth invention, in the electrostatic chuck according to any one of the first to eighth inventions, the heater unit further has a bypass layer as a power feeding path to the first heater element and the second heater element, and the bypass layer is electrically connected to the first main power feeding portion by being in direct contact with the first main power feeding portion.

According to the electrostatic chuck, the bypass layer is provided, so that the degree of freedom in arranging the power feeding terminals can be increased. For example, the power feeding terminals that are likely to be singular points of temperature can be disposed in a dispersed manner, and heat is likely to diffuse around the singular points. Accordingly, the uniformity of the in-plane temperature distribution of the process object can be improved. In addition, since the bypass layer is provided, the power feeding terminal having a large heat capacity can be configured not to be directly connected to the first heater element and the second heater element. Accordingly, the uniformity of the in-plane temperature distribution of the process object can be improved. In addition, since the bypass layer is provided, the power feeding terminal may not be necessarily connected to the relatively thin first heater element and the second heater element directly. Accordingly, the reliability of the heater unit can be improved. In addition, since the bypass layer is in direct contact with the first main power feeding portion and is electrically connected to the first main power feeding portion, the degree of freedom in arranging the power feeding terminals is improved.

In a tenth invention, in the electrostatic chuck according to the ninth invention, the second heater element is provided between the bypass layer and the first heater element in the Z-direction.

According to the electrostatic chuck, the second heater element is provided between the bypass layer and the first heater element in the Z-direction, so that the first heater element and the second heater element are disposed on one side of the bypass layer. Accordingly, when the power feeding terminal is connected to the bypass layer, the power feeding terminal can be connected to the bypass layer from the side opposite to the first heater element and the second heater element. Therefore, a hole part for passing the power feeding terminal may not be necessarily provided in the first heater element or the second heater element, and the uniformity of the in-plane temperature distribution of the first heater element or the second heater element can be improved.

In an eleventh invention, in the electrostatic chuck according to any one of the first to tenth inventions, the first heater element generates less heat than the second heater element.

According to the electrostatic chuck, the first heater element generates a smaller heat amount than the second heater element, so that the in-plane temperature unevenness of the process object caused by the pattern of the second heater element can be suppressed by the first heater element. Therefore, the uniformity of the in-plane temperature distribution of the process object can be improved.

In a twelfth invention, in the electrostatic chuck according to any one of the first to tenth inventions, a volume resistivity of the first heater element is higher than a volume resistivity of the second heater element.

According to the electrostatic chuck, the volume resistivity of the first heater element is allowed to be higher than the volume resistivity of the second heater element, so that the output of the first heater element can be allowed to be lower than the output of the second heater element. Accordingly, the in-plane temperature unevenness of the process object caused by the pattern of the second heater element can be suppressed by the first heater element. Therefore, the uniformity of the in-plane temperature distribution of the process object can be improved.

In a thirteenth invention, in the electrostatic chuck according to any one of the first to twelfth inventions, the heater unit is provided between the ceramic dielectric substrate and the base plate.

In a fourteenth invention, in the electrostatic chuck according to any one of the first to twelfth inventions, t the heater unit is provided within the ceramic dielectric substrate between the first major surface and the second major surface.

According to these electrostatic chucks, the uniformity of the in-plane temperature distribution of the process object can be improved.

In a fifteenth invention, there is provided a semiconductor manufacturing apparatus including the electrostatic chuck of any one of the first to the fourteenth inventions.

Hereinafter, embodiments of the invention will be described with reference to the drawings. It is noted that, in each figure, similar components are denoted by the same reference numerals, and detailed description thereof will be omitted as appropriate.

FIG. 1 is a perspective view schematically illustrating an electrostatic chuck according to an embodiment.

Figure 2A:
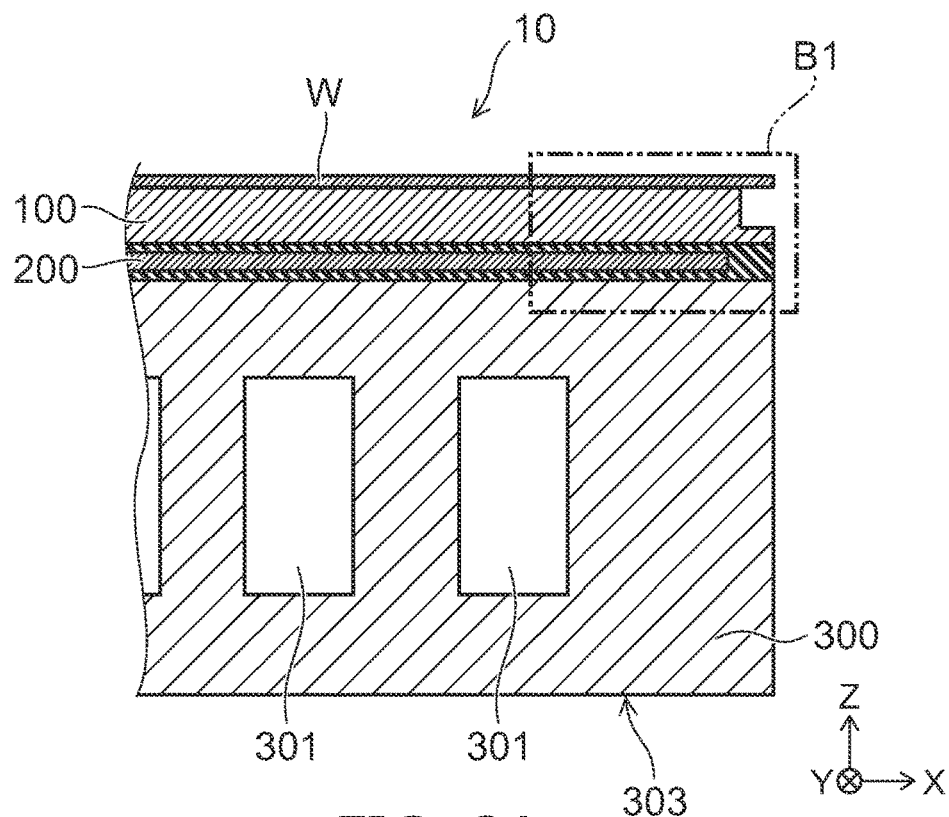
FIGS. 2A and 2B are cross-sectional views schematically illustrating a portion of the electrostatic chuck according to the embodiment.
Figure 2B:
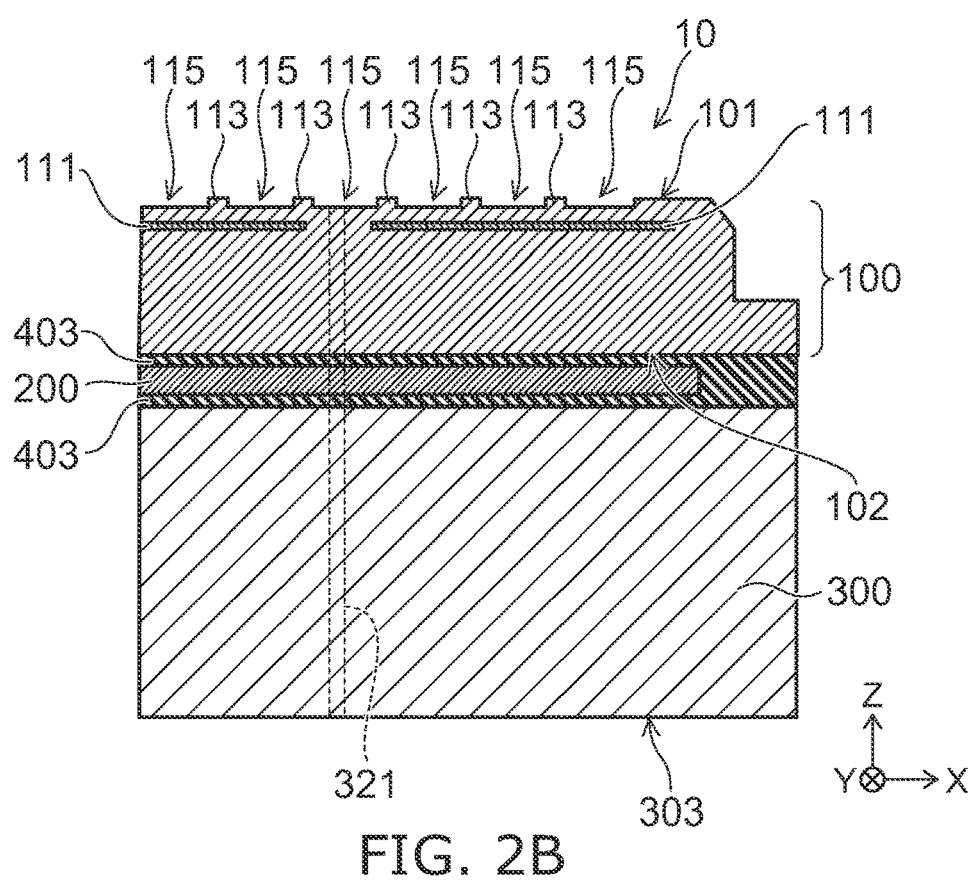

FIGS. 2A and 2B are cross-sectional views schematically illustrating a portion of the electrostatic chuck according to the embodiment.

In FIG. 1, for the convenience of description, a cross-sectional view is illustrated in a portion of the electrostatic chuck.

FIG. 2A is a cross-sectional view taken along line A1-A1 illustrated in FIG. 1.

FIG. 2B is an enlarged view of a region B1 illustrated in FIG. 2A. It is noted that, in FIG. 2B, a process object W is omitted.

As illustrated in FIGS. 1, 2A, and 2B, the electrostatic chuck 10 according to the embodiment includes a ceramic dielectric substrate 100, a heater unit 200, and a base plate 300.

The ceramic dielectric substrate 100 is, for example, a flat plate-shaped base material made of a polycrystalline ceramic sintered body and has a first major surface 101 on which a process object W such as a semiconductor wafer is mounted and a second major surface 102 which is a side opposite to the first major surface 101.

In the specification, the direction perpendicular to the first major surface 101 is defined as a Z-direction. In other words, the Z-direction is a direction connecting the first major surface 101 and the second major surface 102. In other words, the Z-direction is a direction from the base plate 300 toward the ceramic dielectric substrate 100. In addition, one of the directions orthogonal to the Z-direction is defined as an X-direction, and the direction orthogonal to the Z-direction and the X-direction is defined as a Y-direction. In the specification, "in-plane" denotes, for example, in an XY plane. In addition, in the specification, "plan view" indicates a state viewed along the Z-direction.

As a crystal material contained in the ceramic dielectric substrate 100, $Al_2O_3$, $Y_2O_3$, YAG, and the like may be exemplified. Such a material is allowed to be used, so that infrared transmittance, dielectric strength, and plasma durability of the ceramic dielectric substrate 100 can be improved.

An electrode layer 111 is provided inside the ceramic dielectric substrate 100. The electrode layer 111 is interposed between the first major surface 101 and the second major surface 102. That is, the electrode layer 111 is formed so as to be inserted into the ceramic dielectric substrate 100. The electrode layer 111 is integrally sintered on the ceramic dielectric substrate 100.

It is noted that the electrode layer 111 is not limited to being interposed between the first major surface 101 and the second major surface 102, but the electrode layer 111 may be attached to the second major surface 102.

The electrostatic chuck 10 generates charges on the first major surface 101 side of the electrode layer 111 by applying a clamping voltage to the electrode layer 111 and clamping holds the process object W by the electrostatic force.

The electrode layer 111 is provided along the first major surface 101 and the second major surface 102. The electrode layer 111 is a clamping electrode for clamping holding the process object W. The electrode layer 111 may be of a unipolar type or a bipolar type. In addition, the electrode layer 111 may be of a tripolar type or of a multipolar type. The number of electrode layers 111 and the arrangement of the electrode layers 111 are appropriately selected.

The base plate 300 is provided on the second major surface 102 side of the ceramic dielectric substrate 100 and supports the ceramic dielectric substrate 100. A communicating path 301 is provided to the base plate 300. That is, the communicating path 301 is provided inside the base plate 300. As the material of the base plate 300, aluminum may be exemplified.

The base plate 300 serves to adjust the temperature of the ceramic dielectric substrate 100. For example, in the case of cooling the ceramic dielectric substrate 100, a cooling medium is allowed to flow into the communicating path 301, pass through the communicating path 301, and flow out from the communicating path 301. Accordingly, the heat of the base plate 300 can be absorbed by the cooling medium, and the ceramic dielectric substrate 100 mounted on the base plate 300 can be cooled.

In addition, convex portions 113 are provided on the first major surface 101 side of the ceramic dielectric substrate 100, as needed. Grooves 115 are provided between the adjacent convex portions 113. The grooves 115 communicate with each other. A space is formed between a back side of the process object W mounted on the electrostatic chuck 10 and the grooves 115.

An introduction path 321 penetrating the base plate 300 and the ceramic dielectric substrate 100 is connected to the groove 115. When a transfer gas such as helium (He) is introduced from the introduction path 321 in a state where the process object W is clamped and held, the transfer gas flows into the space provided between the process object W and the groove 115, and the process object W can be directly heated or cooled by the transfer gas.

The heater unit 200 heats the ceramic dielectric substrate 100. The heater unit 200 heats the ceramic dielectric substrate 100 to heat the process object W via the ceramic dielectric substrate 100. In the example, the heater unit 200 is separate from the ceramic dielectric substrate 100 and is provided between the ceramic dielectric substrate 100 and the base plate 300.

An adhesive layer 403 is provided between the base plate 300 and the heater unit 200. The adhesive layer 403 is provided between the heater unit 200 and the ceramic dielectric substrate 100. As the material of the adhesive layer 403, heat-resistant resins such as silicone having relatively high thermal conductivity may be exemplified. The thickness of the adhesive layer 403 is, for example, about 0.1 millimeters (mm) or more and 1.0 mm or less. The thickness of the adhesive layer 403 is the same as the distance between the base plate 300 and the heater unit 200 or the distance between the heater unit 200 and the ceramic dielectric substrate 100.

Figure 3A:
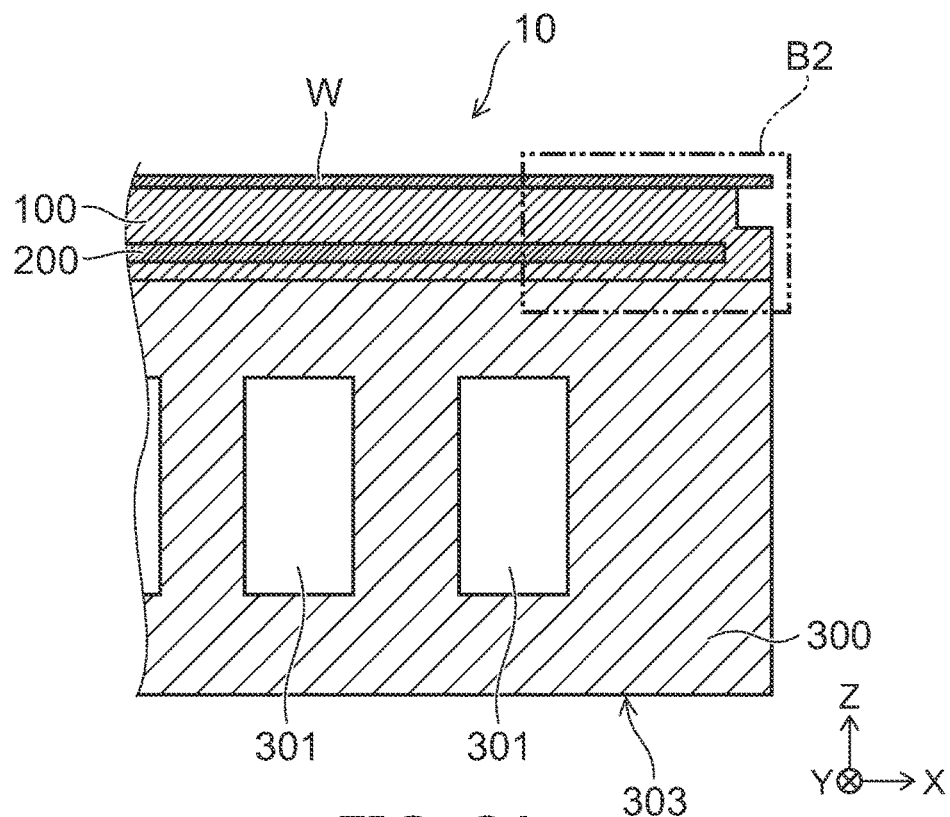
FIGS. 3A and 3B are cross-sectional views schematically illustrating a portion of an electrostatic chuck according to a variation of the embodiment.
Figure 3B:
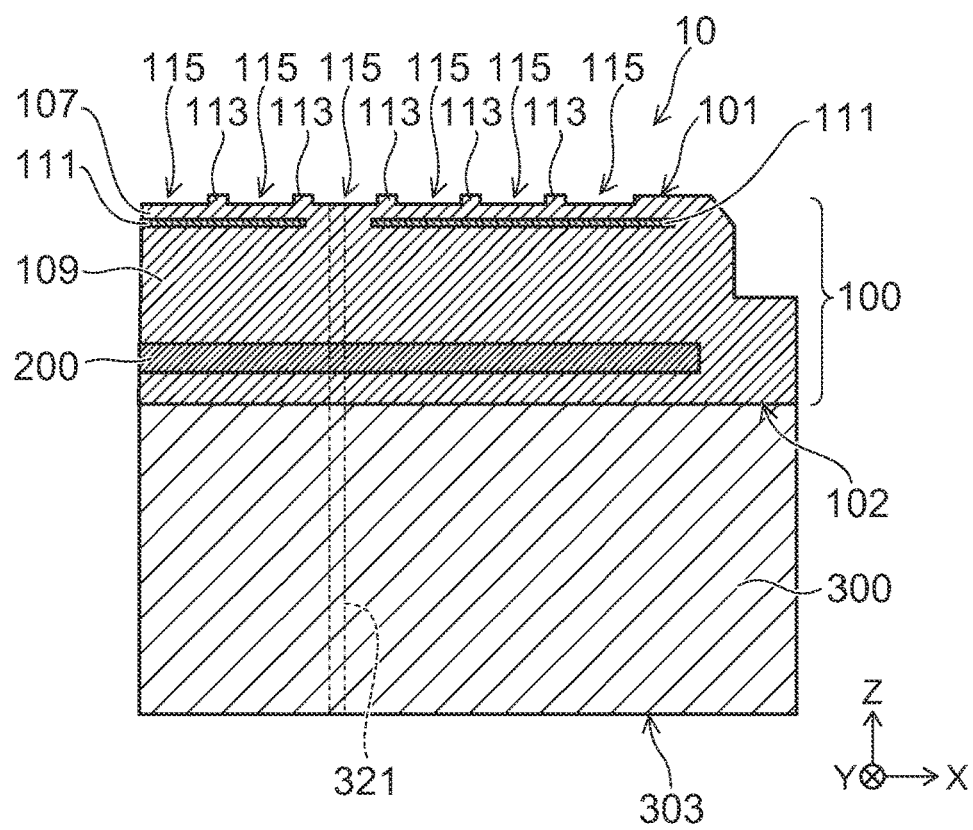

FIGS. 3A and 3B are cross-sectional views schematically illustrating a portion of an electrostatic chuck according to a variation of the embodiment.

FIG. 3B is an enlarged view of a region B2 illustrated in FIG. 3A. It is noted that, in FIG. 3B, the process object W is omitted.

As illustrated in FIGS. 3A and 3B, in the example, the heater unit 200 is provided between the first major surface 101 and the second major surface 102. That is, the heater unit 200 may be formed so as to be inserted into the ceramic dielectric substrate 100. In other words, the heater unit 200 may be built in the ceramic dielectric substrate 100. In this case, the adhesive layer 403 is omitted.

Figure 4:
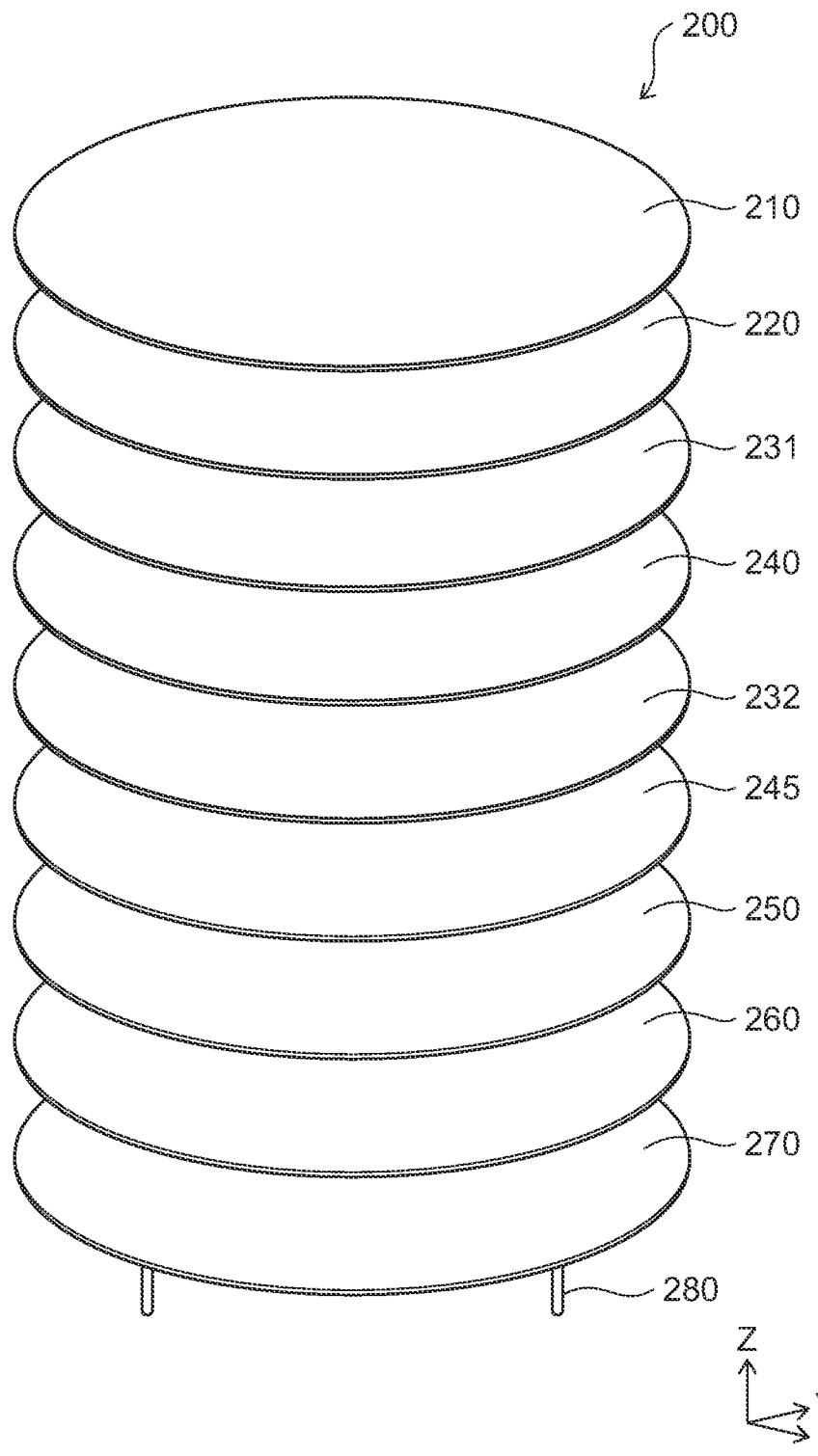
FIG. 4 is an exploded perspective view schematically illustrating the heater unit according to the embodiment.

FIG. 4 is an exploded perspective view schematically illustrating the heater unit according to the embodiment.

Figure 5:
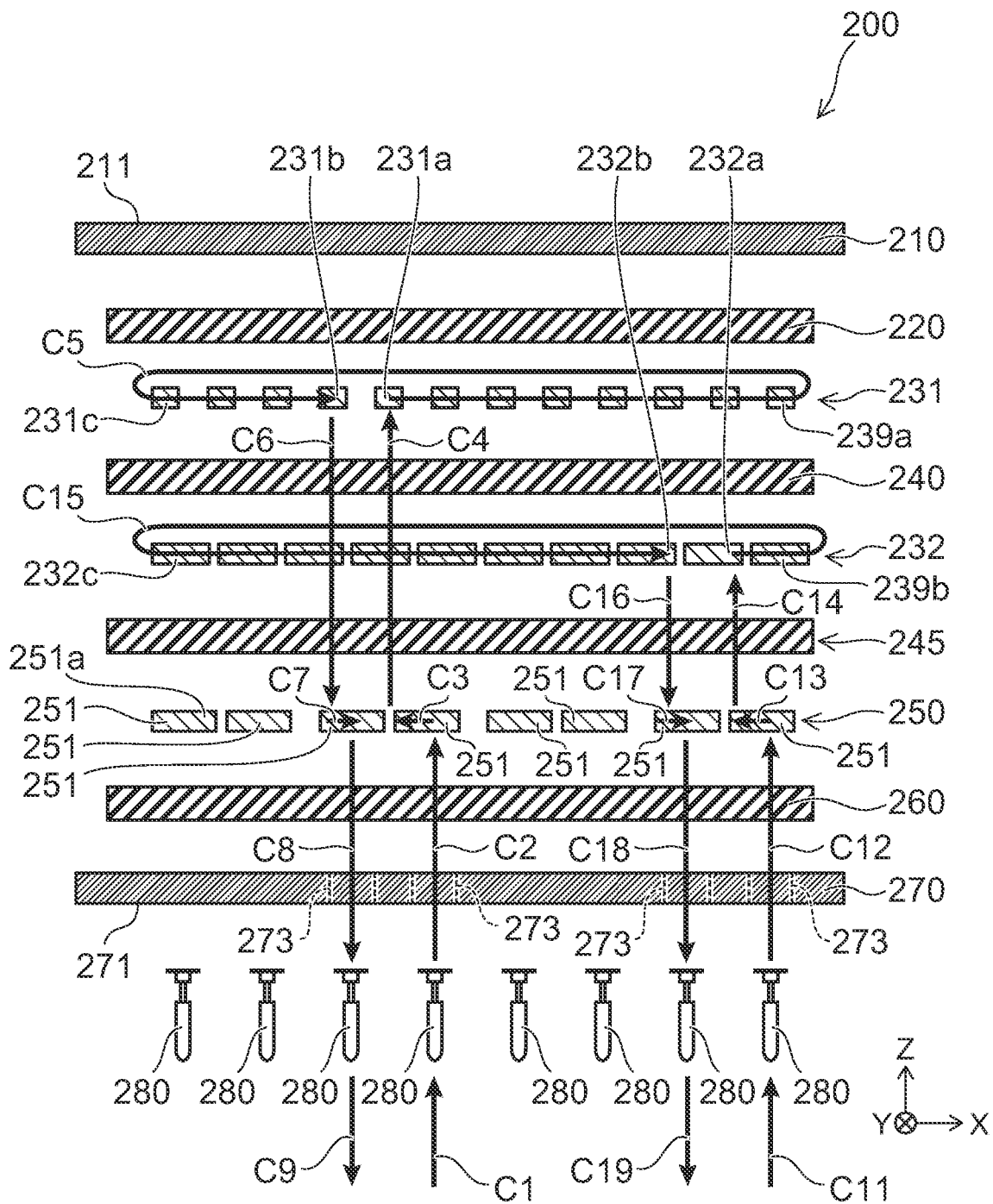
FIG. 5 is an exploded cross-sectional view schematically illustrating the heater unit according to the embodiment.

FIG. 5 is an exploded cross-sectional view schematically illustrating the heater unit according to the embodiment.

It is noted that, in FIGS. 4 and 5, as illustrated in FIGS. 2A and 2B, a case where the heater unit 200 is provided between the ceramic dielectric substrate 100 and the base plate 300 will be described as an example. In the example, the heater unit 200 includes support plates (a first support plate 210 and a second support plate 270), but the support plates may not be provided. When the heater unit 200 is provided between the first major surface 101 and the second major surface 102 of the ceramic dielectric substrate 100 as illustrated in FIGS. 3A and 3B, the first support plate 210 and the second support plate 270 may be omitted.

As illustrated in FIGS. 4 and 5, in the example, the heater unit 200 includes the first support plate 210, a first insulating layer 220, a first heater element 231, a second insulating layer 240, a second heater element 232, a third insulating layer 245, a bypass layer 250, a fourth insulating layer 260, the second support plate 270, and a power feeding terminal 280.

The first support plate 210 is provided on the first heater element 231, the second heater element 232, the bypass layer 250, and the like. The second support plate 270 is provided under the first heater element 231, the second heater element 232, the bypass layer 250, and the like. A surface 211 (upper surface) of the first support plate 210 constitutes the upper surface of the heater unit 200. A surface 271 (lower surface) of the second support plate 270 constitutes the lower surface of the heater unit 200. It is noted that, when the heater unit 200 is built in the ceramic dielectric substrate 100, the first support plate 210 and the second support plate 270 can be omitted.

The first support plate 210 and the second support plate 270 are support plates that support the first heater element 231, the second heater element 232, and the like. In the example, the first support plate 210 and the second support plate 270 interposes and supports the first insulating layer 220, the first heater element 231, the second insulating layer 240, the second heater element 232, the third insulating layer 245, the bypass layer 250, and the fourth insulating layer 260.

The first insulating layer 220 is provided between the first support plate 210 and the second support plate 270. The first heater element 231 is provided between the first insulating layer 220 and the second support plate 270. In this manner, the first heater element 231 is provided so as to overlap the first support plate 210. In other words, the first insulating layer 220 is provided between the first support plate 210 and the first heater element 231. When the heater unit 200 is built in the ceramic dielectric substrate 100, the ceramic dielectric substrate 100 also serves as the first insulating layer 220.

The second insulating layer 240 is provided between the first heater element 231 and the second support plate 270. The second heater element 232 is provided between the second insulating layer 240 and the second support plate 270. In this manner, the second heater element 232 is provided in a layer different from the layer in which the first heater element 231 is provided. At least a portion of the second heater element 232 overlaps the first heater element 231 in the Z-direction. The third insulating layer 245 is provided between the second heater element 232 and the second support plate 270. The bypass layer 250 is provided between the third insulating layer 245 and the second support plate 270. The fourth insulating layer 260 is provided between the bypass layer 250 and the second support plate 270.

In other words, the first heater element 231 is provided between the first insulating layer 220 and the second insulating layer 240. In other words, the second heater element 232 is provided between the second insulating layer 240 and the third insulating layer 245. In other words, the bypass layer 250 is provided between the third insulating layer 245 and the fourth insulating layer 260.

The first heater element 231 is in contact with, for example, each of the first insulating layer 220 and the second insulating layer 240. The second heater element 232 is in contact with, for example, each of the second insulating layer 240 and the third insulating layer 245. The bypass layer 250 is in contact with, for example, each of the third insulating layer 245 and the fourth insulating layer 260.

It is noted that the bypass layer 250 and the fourth insulating layer 260 are provided as necessary and can be omitted. When the bypass layer 250 and the fourth insulating layer 260 are not provided, the third insulating layer 245 is in contact with the second support plate 270. Hereinafter, a case where the heater unit 200 includes the bypass layer 250 and the fourth insulating layer 260 will be described as an example.

The first support plate 210 has a relatively high thermal conductivity. For example, the thermal conductivity of the first support plate 210 is higher than the thermal conductivity of the first heater element 231 and higher than the thermal conductivity of the second heater element 232. As the material of the first support plate 210, a metal containing at least one of aluminum, copper, and nickel, graphite having a multi-layer structure, and the like may be exemplified. The thickness (length in the Z-direction) of the first support plate 210 is, for example, about 0.1 mm or more and 3.0 mm or less. Preferably, the thickness of the first support plate 210 is, for example, about 0.3 mm or more and 1.0 mm or less. The first support plate 210 allows the uniformity of the in-plane temperature distribution of the heater unit 200 to be improved. The first support plate 210 functions as, for example, a heat soaking plate. The first support plate 210 suppresses the warping of the heater unit 200. The first support plate 210 allows the adhesive strength between the heater unit 200 and the ceramic dielectric substrate 100 to be improved.

The material, thickness, and function of the second support plate 270 are the same as the material, thickness, and function of the first support plate 210, respectively. For example, the thermal conductivity of the second support plate 270 is higher than the thermal conductivity of the first heater element 231 and higher than the thermal conductivity of the second heater element 232. It is noted that, in the embodiment, at least one of the first support plate 210 and the second support plate 270 may be omitted.

As the material of the first insulating layer 220, for example, an insulating material such as resin or ceramic can be used. As the case where the first insulating layer 220 is a resin, polyimide and polyamide-imide may be exemplified. As the case where the first insulating layer 220 is ceramic, $Al_2O_3$, $Y_2O_3$, YAG, and the like may be exemplified. The thickness (length in the Z-direction) of the first insulating layer 220 is, for example, about 0.01 mm or more and 0.20 mm or less. The first insulating layer 220 joins the first support plate 210 and the first heater element 231. The first insulating layer 220 electrically insulates between the first support plate 210 and the first heater element 231. In this manner, the first insulating layer 220 has an electrical insulation function and a surface joining function. It is noted that the first insulating layer 220 may have at least an insulation function and may have other functions such as a heat conduction function and a diffusion prevention function.

The material and thickness of the second insulating layer 240 are about the same as the material and thickness of the first insulating layer 220, respectively. The material and thickness of the third insulating layer 245 are about the same as the material and thickness of the first insulating layer 220, respectively. The material and thickness of the fourth insulating layer 260 are about the same as the material and thickness of the first insulating layer 220, respectively.

The second insulating layer 240 joins the first heater element 231 and the second heater element 232. The second insulating layer 240 electrically insulates between the first heater element 231 and the second heater element 232. In this manner, the second insulating layer 240 has the electrical insulation function and the surface joining function. It is noted that the second insulating layer 240 may have at least an insulation function and may have other functions such as a heat conduction function and a diffusion prevention function.

The third insulating layer 245 joins the second heater element 232 and the bypass layer 250. The third insulating layer 245 electrically insulates between the second heater element 232 and the bypass layer 250. In this manner, the third insulating layer 245 has the electrical insulation function and the surface joining function. It is noted that the third insulating layer 245 may have at least an insulation function, and may have other functions such as a heat conduction function and a diffusion prevention function.

The fourth insulating layer 260 joins the bypass layer 250 and the second support plate 270. The fourth insulating layer 260 electrically insulates between the bypass layer 250 and the second support plate 270. In this manner, the fourth insulating layer 260 has the electrical insulation function and the surface joining function. It is noted that the fourth insulating layer 260 may have at least an insulation function and may have other functions such as a heat conduction function and a diffusion prevention function.

As materials of the first heater element 231, metals containing at least one of, for example, stainless steel, titanium, chromium, nickel, copper, aluminum, Inconel (registered trademark), molybdenum, tungsten, palladium, platinum, silver, tantalum, molybdenum carbide, and tungsten carbide may be exemplified. The thickness (length in the Z-direction) of the first heater element 231 is, for example, about 0.01 mm or more and 0.20 mm or less. The material and thickness of the second heater element 232 are about the same as the material and thickness of the first heater element 231, respectively. Each of the first heater element 231 and the second heater element 232 is electrically connected to, for example, the bypass layer 250. On the other hand, each of the first heater element 231 and the second heater element 232 is electrically insulated from the first support plate 210 and the second support plate 270.

Each of the first heater element 231 and the second heater element 232 generates heat when the current flows. The first heater element 231 and the second heater element 232 heat the ceramic dielectric substrate 100 by generating heat. Since the first heater element 231 and the second heater element 232 heat the process object W through, for example, the ceramic dielectric substrate 100, the in-plane temperature distribution of the process object W is allowed to be uniform. Alternatively, by heating the process object W through, for example, the ceramic dielectric substrate 100, the first heater element 231 and the second heater element 232 may intentionally make a difference in the in-plane temperature of the process object W.

The bypass layer 250 is disposed substantially parallel to the first support plate 210 and substantially parallel to the second support plate 270. The bypass layer 250 has multiple bypass portions 251. In the example, the bypass layer 250 has the eight bypass portions 251. The number of bypass portions 251 is not limited to "eight". The bypass layer 250 has a plate shape.

The bypass layer 250 has, for example, a conductive property. The bypass layer 250 is electrically connected to, for example, the first heater element 231 and the second heater element 232. The bypass layer 250 is a power feeding path for the first heater element 231 and the second heater element 232. On the other hand, the bypass layer 250 is electrically insulated from, for example, the first support plate 210 and the second support plate 270 by an insulating layer.

The thickness (length in the Z-direction) of the bypass layer 250 is, for example, about 0.03 mm or more and 0.30 mm or less. The thickness of the bypass layer 250 is larger than that of the first insulating layer 220. The thickness of the bypass layer 250 is larger than that of the second insulating layer 240. The thickness of the bypass layer 250 is larger than that of the third insulating layer 245. The thickness of the bypass layer 250 is larger than that of the fourth insulating layer 260.

For example, the material of the bypass layer 250 is the same as the material of the first heater element 231 and the second heater element 232. On the other hand, the thickness of the bypass layer 250 is larger than the thickness of the first heater element 231 and larger than the thickness of the second heater element 232. Therefore, the electric resistance of the bypass layer 250 is lower than the electric resistance of the first heater element 231 and lower than the electric resistance of the second heater element 232. Accordingly, even when the material of the bypass layer 250 is the same as the material of the first heater element 231 and the second heater element 232, it is possible to suppress the bypass layer 250 from generating heat similarly to the first heater element 231 and the second heater element 232. That is, the electric resistance of the bypass layer 250 can be suppressed, and the generated heat amount by the bypass layer 250 can be suppressed.

It is noted that a method for suppressing the electrical resistance of the bypass layer 250 and suppressing the generated heat amount of the bypass layer 250 may be implemented by using a material having a relatively low volume resistivity instead of the thickness of the bypass layer 250. That is, the material of the bypass layer 250 may be different from the material of the first heater element 231 and the second heater element 232. As the material of the bypass layer 250, metals containing at least one of, for example, stainless steel, titanium, chromium, nickel, copper, and aluminum may be exemplified.

The power feeding terminal 280 is electrically connected to the bypass layer 250. In a state where the heater unit 200 is provided between the base plate 300 and the ceramic dielectric substrate 100, the power feeding terminal 280 is provided from the heater unit 200 toward the base plate 300. The power feeding terminal 280 supplies the power supplied from the outside of the electrostatic chuck 10 to the first heater element 231 and the second heater element 232 via the bypass layer 250. The power feeding terminal 280 may be directly connected to, for example, the first heater element 231 and the second heater element 232. Accordingly, the bypass layer 250 can be omitted.

On the other hand, when the first heater element 231 and/or the second heater element 232 has a large number of zones, for example, 20 zones or more, 50 zones or more, or 100 zones or more, it is difficult to arrange the power feeding terminals 280 corresponding to the respective zones. The bypass layer 250 is provided, so that the degree of freedom in arranging the power feeding terminals 280 is improved in comparison with a case where the power feeding terminals 280 is provided for each zone.

The heater unit 200 has the multiple power feeding terminals 280. In the example, the heater unit 200 has the eight power feeding terminals 280. The number of power feeding terminals 280 is not limited to "eight". One power feeding terminal 280 is electrically connected to one bypass portion 251. That is, the number of power feeding terminals 280 is the same as the number of bypass portions 251. The hole 273 penetrates the second support plate 270. The power feeding terminal 280 is electrically connected to the bypass portion 251 through the hole 273.

The first heater element 231 has a first sub-power feeding portion 231a, a second sub-power feeding portion 231b, and a sub-heater line 231c. The sub-heater line 231c is electrically connected to the first sub-power feeding portion 231a and the second sub-power feeding portion 231b. The first sub-power feeding portion 231a is provided at one end of the sub-heater line 231c, and the second sub-power feeding portion 231b is provided at the other end of the sub-heater line 231c. The sub-heater line 231c generates heat due to the flow of the current. The first sub-power feeding portion 231a and the second sub-power feeding portion 231b feed power to the sub-heater line 231c. The first heater element 231 is electrically connected to the bypass layer 250 in the first sub-power feeding portion 231a and the second sub-power feeding portion 231b.

When power is supplied from the outside of the electrostatic chuck 10 to the power feeding terminal 280 as indicated by arrows C1 and C2 illustrated in FIG. 5, the current flows from the power feeding terminal 280 to the bypass layer 250. As indicated by arrows C3 and C4 illustrated in FIG. 5, the current flowing to the bypass layer 250 flows from the bypass layer 250 to the first heater element 231. As indicated by arrows C5 and C6 illustrated in FIG. 5, the current flowing to the first heater element 231 flows through a predetermined region of the first heater element 231 and flows from the first heater element 231 to the bypass layer 250. More specifically, the current flowing to the bypass layer 250 flows to the sub-heater line 231c via the first sub-power feeding portion 231a, and flows to the bypass layer 250 via the second sub-power feeding portion 231b. As indicated by arrows C7 and C8 illustrated in FIG. 5, the current flowing to the bypass layer 250 flows from the bypass layer 250 to the power feeding terminal 280. As indicated by an arrow C9 illustrated in FIG. 5, the current flowing to the power feeding terminal 280 flows to the outside of the electrostatic chuck 10.

The second heater element 232 has a first main power feeding portion 232a, a second main power feeding portion 232b, and a main heater line 232c. The main heater line 232c is electrically connected to the first main power feeding portion 232a and the second main power feeding portion 232b. The first main power feeding portion 232a is provided at one end of the main heater line 232c, and the second main power feeding portion 232b is provided at the other end of the main heater line 232c. The main heater line 232c generates heat due to the flow of the current. The first main power feeding portion 232a and the second main power feeding portion 232b feed power to the main heater line 232c. The second heater element 232 is electrically connected to the bypass layer 250 in the first main power feeding portion 232a and the second main power feeding portion 232b.

When power is supplied from the outside of the electrostatic chuck 10 to the power feeding terminal 280 as indicated by arrows C11 and C12 illustrated in FIG. 5, the current flows from the power feeding terminal 280 to the bypass layer 250. As indicated by arrows C13 and C14 illustrated in FIG. 5, the current flowing to the bypass layer 250 flows from the bypass layer 250 to the second heater element 232. As indicated by arrows C15 and C16 illustrated in FIG. 5, the current flowing to the second heater element 232 flows through a predetermined region of the second heater element 232 and flows from the second heater element 232 to the bypass layer 250. More specifically, the current flowing to the bypass layer 250 flows to the main heater line 232c via the first main power feeding portion 232a, and flows to the bypass layer 250 via the second main power feeding portion 232b. As indicated by arrows C17 and C18 illustrated in FIG. 5, the current flowing to the bypass layer 250 flows from the bypass layer 250 to the power feeding terminal 280. As indicated by an arrow C19 illustrated in FIG. 5, the current flowing to the power feeding terminal 280 flows to the outside of the electrostatic chuck 10.

For example, the current flowing to the first heater element 231 and the current flowing to the second heater element 232 are controlled separately. In the example, the bypass portion 251 connected to the first heater element 231 (first sub-power feeding portion 231a and second sub-power feeding portion 231b) and the bypass portion 251 connected to the second heater element 232 (first main power feeding portion 232a and second main power feeding portion 232b) are different. The bypass portion 251 connected to the first heater element 231 (first sub-power feeding portion 231a and second sub-power feeding portion 231b) and the bypass portion 251 connected to the second heater element 232 (first main power feeding portion 232a and second main power feeding portion 232b) may be the same.

The first heater element 231 generates a smaller heat amount than the second heater element 232. That is, the first heater element 231 is a low power sub-heater, and the second heater element 232 is a high power main heater.

In this manner, the first heater element 231 is allowed to generate a smaller heat amount than the second heater element 232, so that the in-plane temperature unevenness of the process object W caused by the pattern of the second heater element 232 can be suppressed by the first heater element 231. Therefore, the uniformity of the in-plane temperature distribution of the process object W can be improved.

The volume resistivity of the first heater element 231 is higher than, for example, the volume resistivity of the second heater element 232. It is noted that the volume resistivity of the first heater element 231 is the volume resistivity of the sub-heater line 231c. That is, the volume resistivity of the first heater element 231 is the volume resistivity between the first sub-power feeding portion 231a and the second sub-power feeding portion 231b. In other words, the volume resistivity of the first heater element 231 is the volume resistivity in the path indicated by the arrow C5 in FIG. 5. Similarly, the volume resistivity of the second heater element 232 is the volume resistivity of the main heater line 232c. That is, the volume resistivity of the second heater element 232 is the volume resistivity between the first main power feeding portion 232a and the second main power feeding portion 232b. In other words, the volume resistivity of the second heater element 232 is the volume resistivity in the path indicated by the arrow C15 in FIG. 5.

In this manner, the volume resistivity of the first heater element 231 is allowed to be higher than the volume resistivity of the second heater element 232, so that the output (generated heat amount, power consumption) of the first heater element 231 can be allowed to be lower than the output (generated heat amount, power consumption) of the second heater element 232. Accordingly, the in-plane temperature unevenness of the process object caused by the pattern of the second heater element can be suppressed by the first heater element. Therefore, the uniformity of the in-plane temperature distribution of the process object can be improved.

The periphery of the power feeding terminal 280 tends to have temperature singular points (points where the temperature is relatively significantly different from the surrounding region). On the other hand, the bypass layer 250 is provided, so that the degree of freedom in arranging the power feeding terminal 280 can be increased. For example, the power feeding terminals 280 which tend to have temperature singular points can be disposed in a dispersed manner, so that heat is easily diffused around the singular points. Accordingly, the uniformity of the in-plane temperature distribution of the process object W can be improved.

The bypass layer 250 is provided, so that the power feeding terminal 280 having a large heat capacity can be configured not to be directly connected to the first heater element 231 and the second heater element 232. Accordingly, the uniformity of the in-plane temperature distribution of the process object W can be improved. In addition, the bypass layer 250 is provided, so that the power feeding terminal 280 may not be necessarily connected directly to the relatively thin first heater element 231 and the second heater element 232. Accordingly, the reliability of the heater unit 200 can be improved.

As described above, the power feeding terminal 280 is provided from the heater unit 200 toward the base plate 300. For this reason, power can be supplied from the side of the lower surface 303 (refer to FIGS. 2A and 2B) of the base plate 300 to the power feeding terminal 280 via a member called a socket or the like. Accordingly, the wiring of the heater is implemented while suppressing the power feeding terminal 280 from being exposed in the chamber in which the electrostatic chuck 10 is installed.

In the example, the first heater element 231 is located above the second heater element 232. In other words, the first heater element 231 is provided between the second heater element 232 and the first major surface 101. The position of the first heater element 231 and the position of the second heater element 232 may be opposite to each other. That is, the second heater element 232 may be located above the first heater element 231. In other words, the second heater element 232 may be provided between the first major surface 101 and the first heater element 231. From the viewpoint of temperature control, it is favorable that the first heater element 231 is located above the second heater element 232.

When the first heater element 231 is located above the second heater element 232, the distance between the first heater element 231 and the process object W is shorter than the distance between the second heater element 232 and the process object W. Since the first heater element 231 is relatively close to the process object W, the temperature of the process object W can be easily controlled by the first heater element 231. That is, the in-plane temperature unevenness of the process object W caused by the pattern of the second heater element 232 can be easily suppressed by the first heater element 231. Therefore, the uniformity of the in-plane temperature distribution of the process object W can be improved.

On the other hand, when the second heater element 232 is located above the first heater element 231, the high power second heater element 232 is relatively close to the process object W. Accordingly, it is possible to improve the temperature responsiveness (temperature raising rate/temperature lowering rate) of the process object W.

In addition, in the example, the second heater element 232 is provided between the bypass layer 250 and the first heater element 231 in the Z-direction. That is, the bypass layer 250 is located below the first heater element 231 and the second heater element 232.

In this manner, since the second heater element 232 is provided between the bypass layer 250 and the first heater element 231 in the Z-direction, the first heater element 231 and the second heater element 232 can be disposed on one side of the bypass layer 250. Accordingly, when the power feeding terminal 280 is connected to the bypass layer 250, the power feeding terminal 280 can be connected to the bypass layer 250 from the side opposite to the first heater element 231 and the second heater element 232. Therefore, a hole part for passing the power feeding terminal 280 in the first heater element 231 or the second heater element 232 does not need to be provided, and the number of temperature singular points on the heater pattern can be reduced, so that the uniformity of the in-plane temperature distribution of the first heater element 231 or the second heater element 232 can be improved.

It is noted that the bypass layer 250 may be located above the first heater element 231 and the second heater element 232. That is, the bypass layer 250 may be provided between the first support plate 210 and the first heater element 231. In addition, the bypass layer 250 may be provided between the first support plate 210 and the second heater element 232. In addition, the bypass layer 250 may be located between the first heater element 231 and the second heater element 232.

In addition, the number of heater elements included in the heater unit 200 is not limited to "two". That is, the heater unit 200 may further have another heater element provided in a layer different from the first heater element 231 and the second heater element 232.

Figure 6:
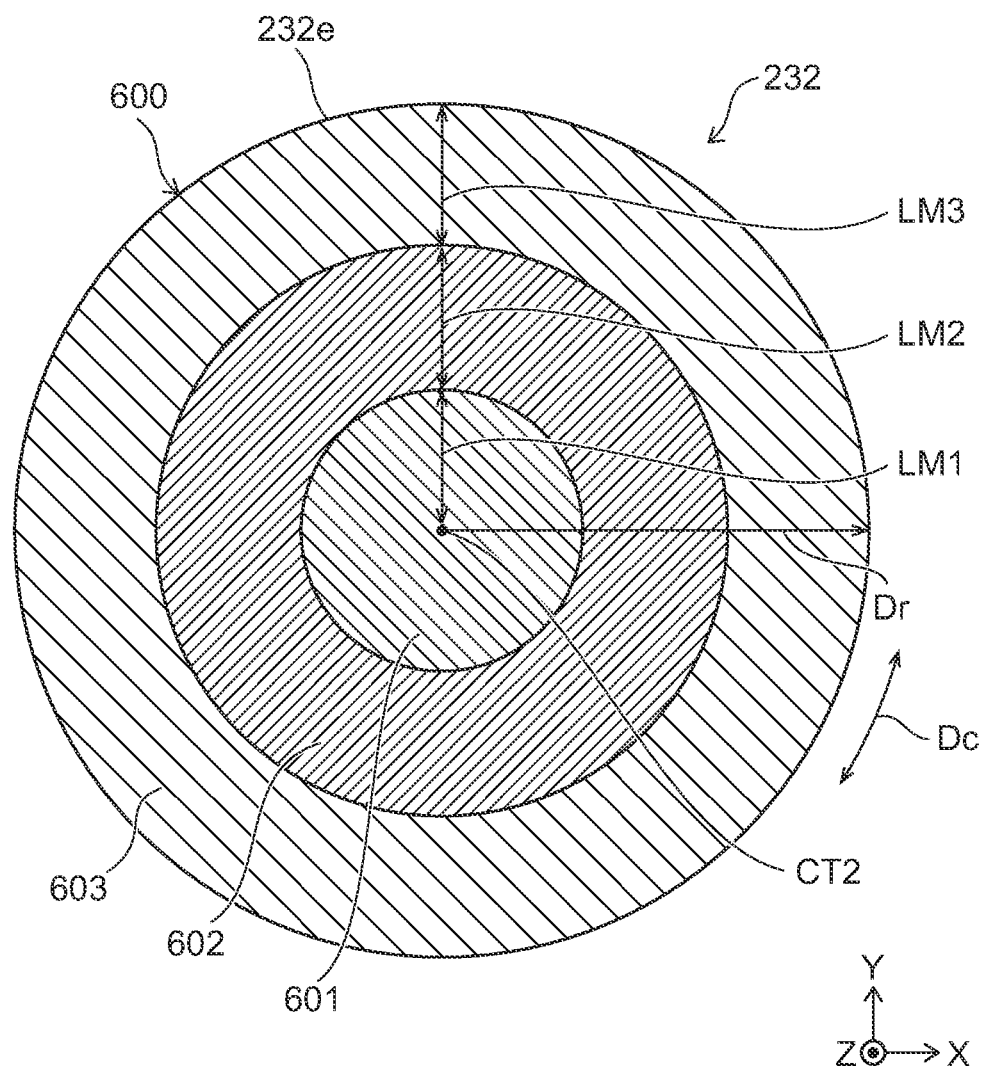
FIG. 6 is a plan view schematically illustrating the main zones of the second heater element according to the first embodiment.

FIG. 6 is a plan view schematically illustrating the main zones of the second heater element according to the first embodiment. FIG. 6 is a view in which the second heater element 232 described in FIG. 4 is projected onto a plane perpendicular to the Z-direction.

As illustrated in FIG. 6, the second heater element 232 has multiple main zones 600 divided in the radial direction Dr. In the second heater element 232, independent temperature control is performed in each of the main zones 600.

In the specification, a "radial direction Dr" is a direction from the center of the heater element toward the outer circumference along a radius. A "circumferential direction Dc" is a direction along the outer circumference of the heater element.

In the example, the multiple main zones 600 have three main zones 601 to 603 aligned in the radial direction Dr. That is, the second heater element 232 is divided into three zones in the radial direction Dr. The main zones 600 are disposed in the order of the main zone 601, the main zone 602, and the main zone 603 from a center CT2 of the second heater element 232 toward the outside in the radial direction Dr.

In the example, the main zone 601 has a circular shape centered on the center CT2 in a plan view. The main zone 602 has an annular shape located outside the main zone 601 and centered on the center CT2 in a plan view. The main zone 603 has an annular shape located outside the main zone 602 and centered on the center CT2 in a plan view.

In the example, a width LM1 of the main zone 601 in the radial direction Dr, a width LM2 of the main zone 602 in the radial direction Dr, and a width LM3 of the main zone 603 in the radial direction Dr are the same as each other. The widths LM1 to LM3 may be different from each other.

It is noted that the number of main zones 600 and the shape of the main zones 600 in a plan view may be arbitrary. In addition, the main zone 600 may be divided in the circumferential direction Dc, or may be divided in the circumferential direction Dc and the radial direction Dr. The configuration in each of the main zones 600 will be described later.

The main heater lines 232c constituting each of the main zones 600 are independent of each other. Accordingly, a different voltage can be applied to each of the main zones 600 (main heater line 232c). Therefore, the output (the generated heat amount) can be controlled independently for each of the main zones 600. In other words, each of the main zones 600 is a heater unit capable of performing independent temperature control in each other, and the second heater element 232 is an aggregate of heater units having multiple heater units.

It is noted that, in FIG. 6, for the convenience, the end portions of the main zones 600 in the radial direction Dr are described to be in contact with each other, but actually, a gap (that is, a portion where the main heater line 232c is not provided) exists between the end portions, and the end portions of the adjacent main zones in the radial direction Dr are not in contact with each other. The following figures are the same.

Figure 7:
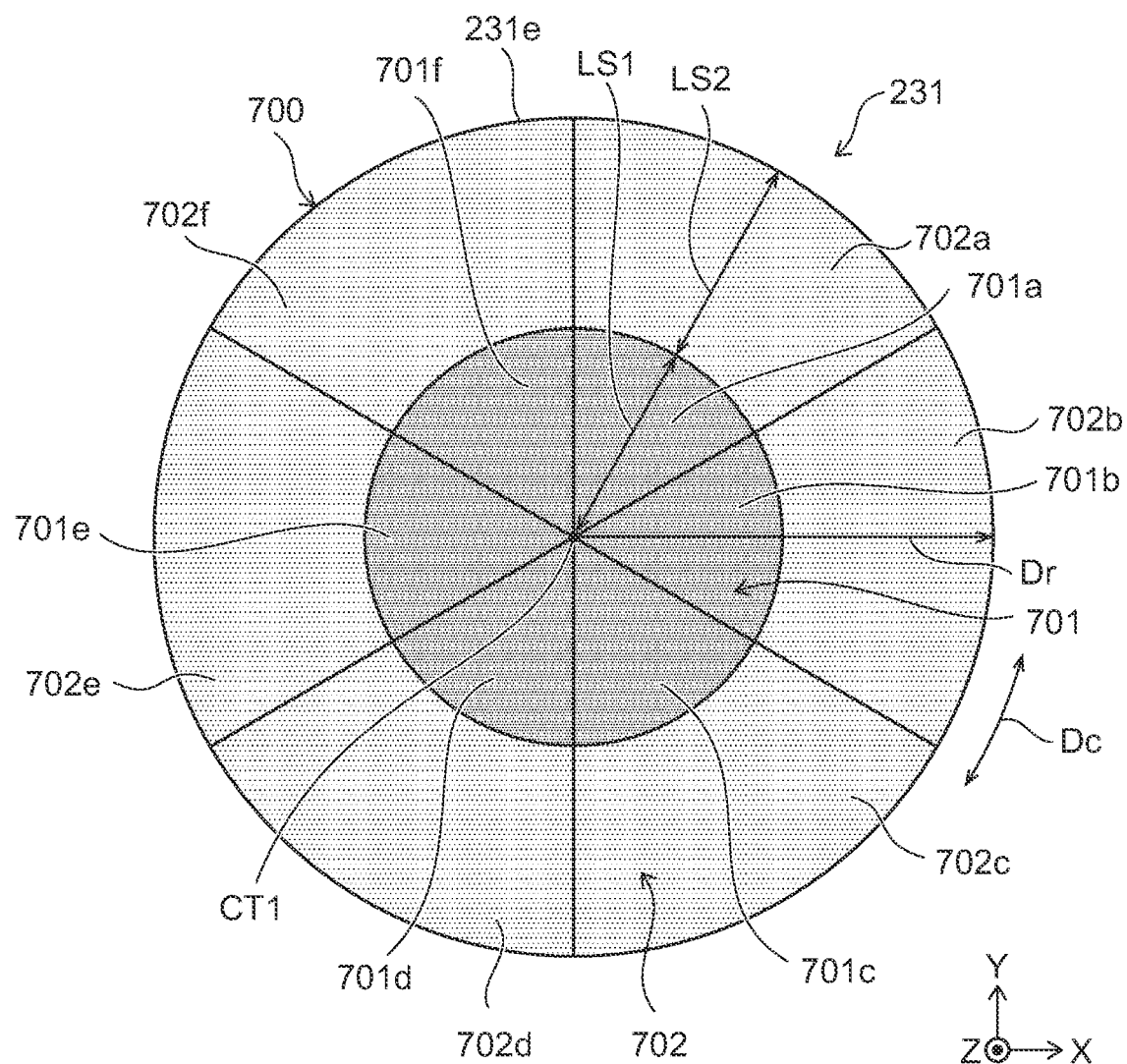
FIG. 7 is a plan view schematically illustrating a sub-zone of the first heater element according to the first embodiment.

FIG. 7 is a plan view schematically illustrating a sub-zone of the first heater element according to the first embodiment. FIG. 7 is a view in which the first heater element 231 illustrated in FIG. 4 is projected onto a plane perpendicular to the Z-direction.

As illustrated in FIG. 7, in the example, the first heater element 231 has multiple sub-zones 700 divided in the radial direction Dr and the circumferential direction Dc. In the first heater element 231, independent temperature control is performed in each of the sub-zones 700.

In the example, the multiple sub-zones 700 have a first region 701 configured with sub-zones 701a to 701f aligned in the circumferential direction Dc and a second region 702 configured with sub-zones 702a to 702f aligned in the circumferential direction Dc. That is, the second heater element 232 is divided into two zones in the radial direction Dr. Furthermore, each of the first region 701 and the second region 702 are divided into six regions in the circumferential direction Dc. The regions are disposed in the order of the first region 701 and the second region 702 from a center CT1 of the first heater element 231 toward the outside in the radial direction Dr.

The first region 701 has a circular shape centered on the center CT1 in a plan view. The second region 702 has an annular shape located outside the first region 701 and centered on the center CT1 in a plan view.

The first region 701 has the sub-zones 701a to 701f. In the first region 701, the sub-zones 701a to 701f are disposed clockwise in the order of the sub-zone 701a, the sub-zone 701b, the sub-zone 701c, the sub-zone 701d, the sub-zone 701e, and the sub-zone 701f. Each of the sub-zones 701a to 701f constitutes a portion of the circular first region 701.

The second region 702 has the sub-zones 702a to 702f. In the second region 702, the sub-zones 702a to 702f are disposed clockwise in the order of the sub-zone 702a, the sub-zone 702b, the sub-zone 702c, the sub-zone 702d, the sub-zone 702e, and the sub-zone 702f. In addition, in the example, the sub-zone 702a is located outside the sub-zone 701a. The sub-zone 702b is located outside the sub-zone 701b. The sub-zone 702c is located outside the sub-zone 701c. The sub-zone 702d is located outside the sub-zone 701d. The sub-zone 702e is located outside the sub-zone 701e. The sub-zone 702f is located outside the sub-zone 701f. Each of the sub-zones 702a to 702f constitutes a portion of the annular second region 702.

In the example, a width LS1 of the first region 701 in the radial direction Dr and a width LS2 of the second region 702 in the radial direction Dr are the same as each other. The width LS1 and the width LS2 may be different from each other.

The number of the multiple sub-zones 700 is larger than the number of the multiple main zones 600. That is, the first heater element 231 is divided into more zones than the second heater element 232.

The number of the multiple sub-zones 700 included in the first heater element 231 is allowed to be larger than the number of the multiple main zones 600 included in the second heater element 232, so that the first heater element 231 can adjust the temperature in a narrower region than the second heater element 232. Accordingly, the first heater element 231 enables finer adjustment of the temperature, so that the uniformity of the in-plane temperature distribution of the process object W can be improved.

The number of sub-zones 700 and the shape of the sub-zones 700 in a plan view may be arbitrary. In addition, the sub-zone 700 may not be divided in the circumferential direction Dc. That is, the first region 701 and the second region 702 may not have the multiple sub-zones 700 divided in the circumferential direction Dc. The configuration in each of the sub-zones 700 will be described later.

The sub-heater lines 231c constituting each of the sub-zones 700 are independent of each other. Accordingly, a different voltage can be applied to each of the sub-zones 700 (sub-heater line 231c). Therefore, the output (the generated heat amount) can be controlled independently for each of the sub-zones 700. In other words, each of the sub-zones 700 is a heater unit capable of performing independent temperature control in each other, and the first heater element 231 is an aggregate of heater units having multiple heater units.

It is noted that, in FIG. 7, for the convenience, the end portions of the sub-zones 700 in the radial direction Dr are described to be in contact with each other, but actually, a gap (that is, a portion where the sub-heater line 231c is not provided) exists between the end portions, and the end portions of the adjacent sub-zones 700 in the radial direction Dr are not in contact with each other. The following figures are the same.

Figure 8:
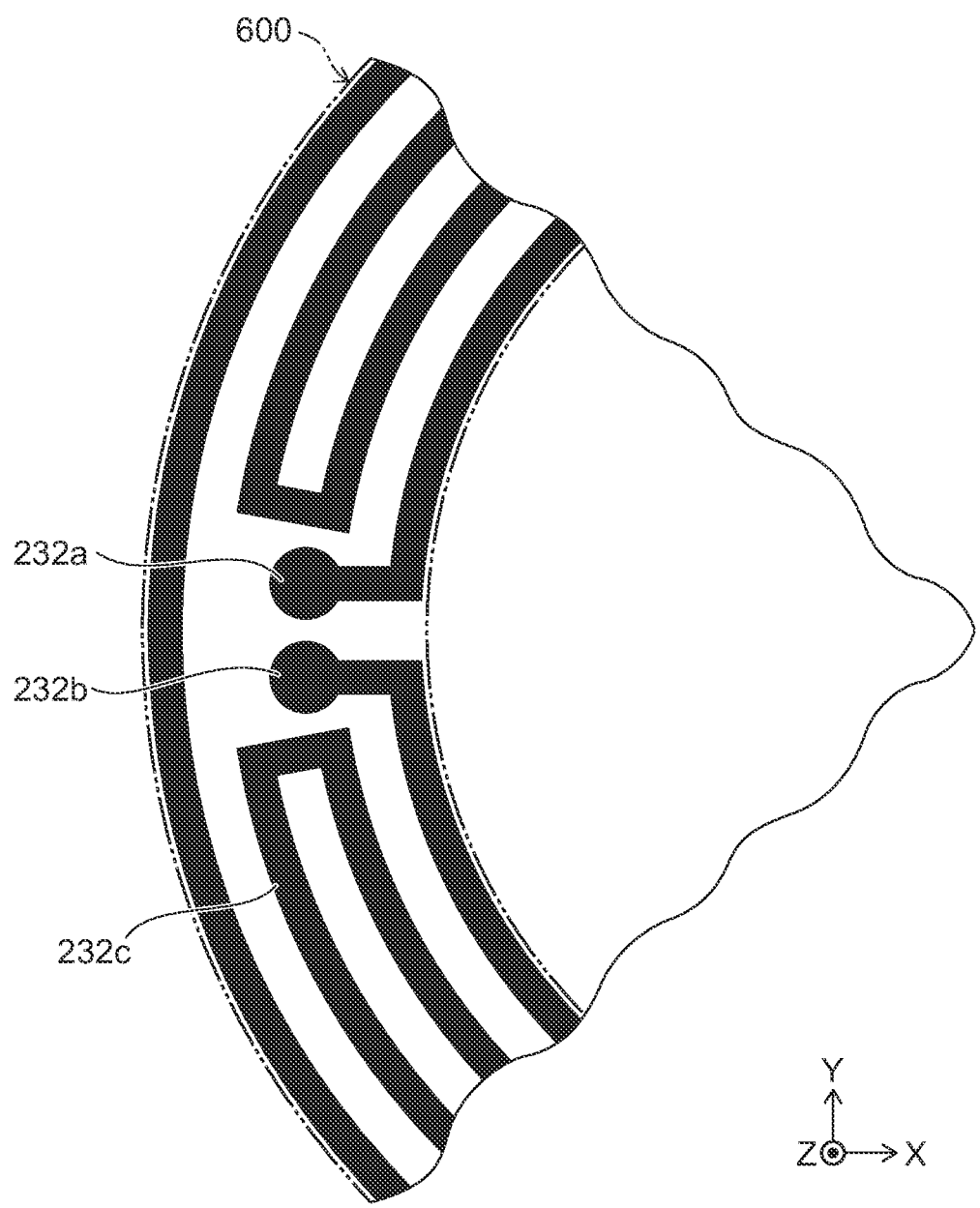
FIG. 8 is a plan view schematically illustrating a portion of the main zone of the second heater element according to the first embodiment.

FIG. 8 is a plan view schematically illustrating a portion of the main zone of the second heater element according to the first embodiment.

As illustrated in FIG. 8, the main zone 600 has the first main power feeding portion 232a, the second main power feeding portion 232b, and the main heater line 232c. One main zone 600 has one first main power feeding portion 232a, one second main power feeding portion 232b, and one main heater line 232c. The main zone 600 is a region configured with a continuous main heater line 232c connecting the first main power feeding portion 232a and the second main power feeding portion 232b.

Figure 9:
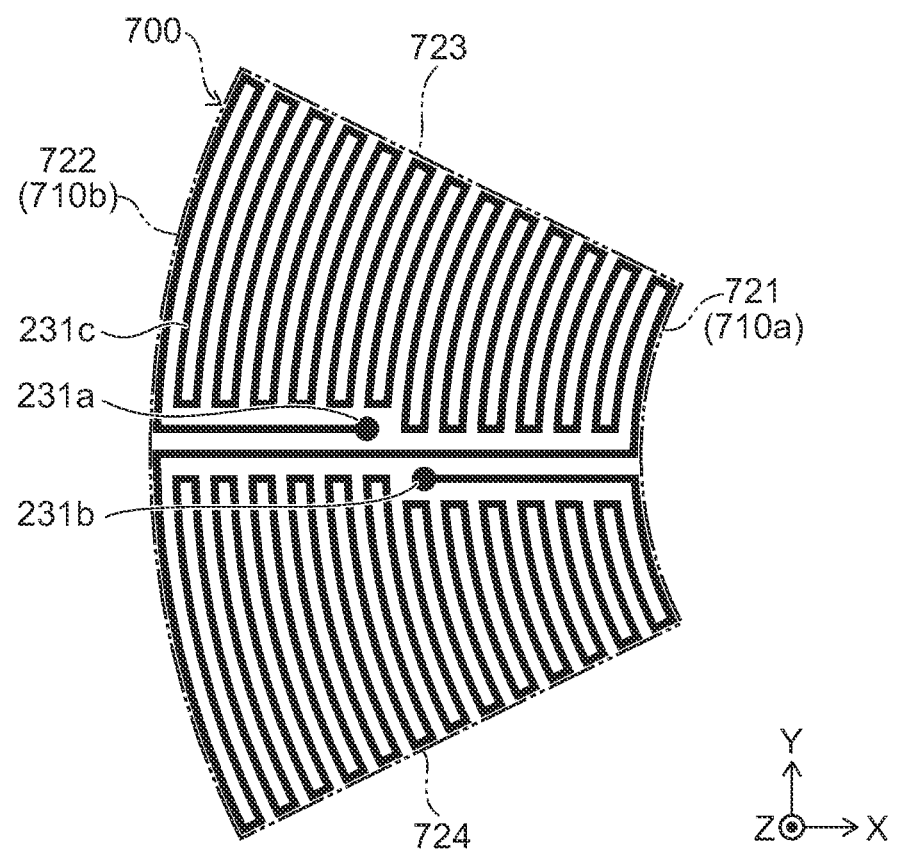
FIG. 9 is a plan view schematically illustrating a portion of the sub-zone of the first heater element according to the first embodiment.

FIG. 9 is a plan view schematically illustrating a portion of the sub-zone of the first heater element according to the first embodiment.

As illustrated in FIG. 9, the sub-zone 700 has the first sub-power feeding portion 231a, the second sub-power feeding portion 231b, and the sub-heater line 231c. One sub-zone 700 has one first sub-power feeding portion 231a, one second sub-power feeding portion 231b, and one sub-heater line 231c. The sub-zone 700 is a region configured with a continuous sub-heater line 231c connecting the first sub-power feeding portion 231a and the second sub-power feeding portion 231b.

Figure 10:
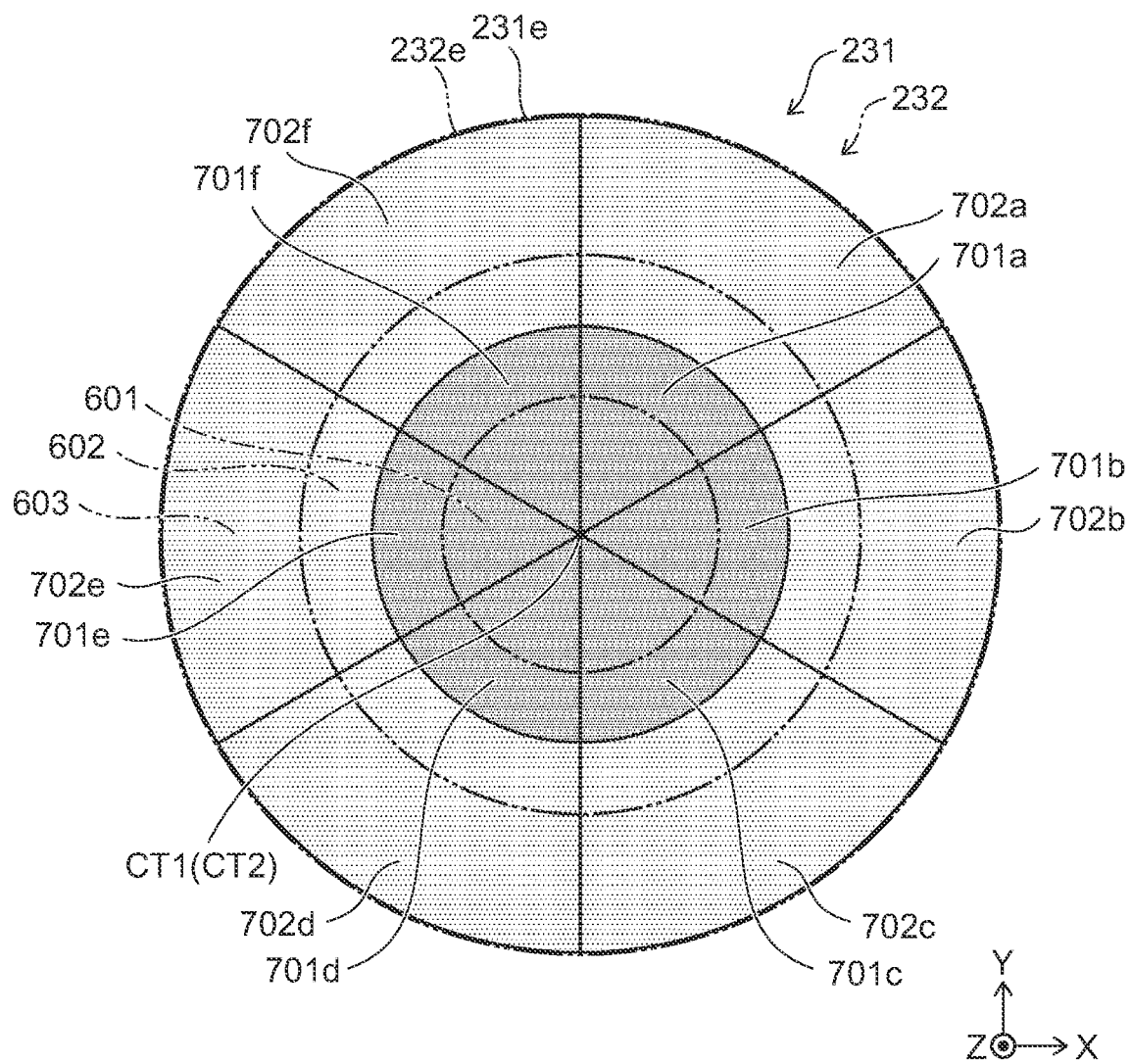
FIG. 10 is a plan view schematically illustrating the positional relationship between the main zone of the second heater element and the sub-zone of the first heater element according to the first embodiment.

FIG. 10 is a plan view schematically illustrating the positional relationship between the main zone of the second heater element and the sub-zone of the first heater element according to the first embodiment.

Figure 11:
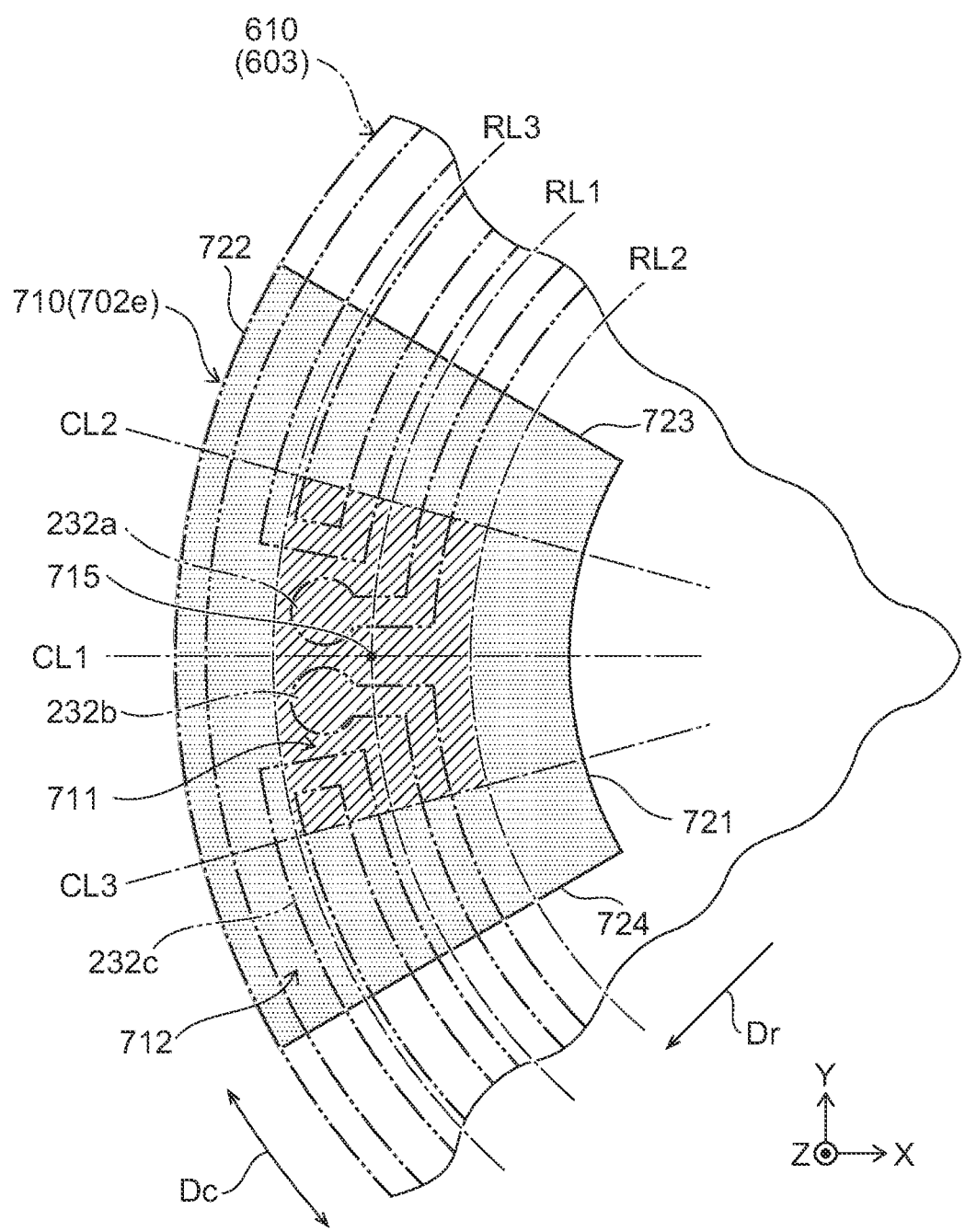
FIG. 11 is a plan view schematically illustrating the positional relationship between a portion of the main zone of the second heater element and a portion of the sub-zone of the first heater element according to the first embodiment.

FIG. 11 is a plan view schematically illustrating the positional relationship between a portion of the main zone of the second heater element and a portion of the sub-zone of the first heater element according to the first embodiment.

FIGS. 10 and 11 illustrate the positional relationship when the second heater element 232 illustrated in FIG. 6 and the first heater element 231 illustrated in FIG. 7 overlap each other as viewed along the Z-direction.

In FIGS. 10 and 11, the main zone 600 of the second heater element 232 is represented by a two-point dashed line, and the sub-zone 700 of the first heater element 231 is represented by a solid line. Hereinafter, when the positional relationship of the second heater element 232 and the first heater element 231 in an overlapped state is represented by a plan view, similarly to FIGS. 10 and 11, the main zone 600 of the second heater element 232 is represented by a two-dot dashed line, and the sub-zone 700 of the first heater element 231 is represented by a solid line.

As illustrated in FIG. 10, the first heater element 231 and the second heater element 232 are disposed so that, for example, a center CT1 of the first heater element 231 and a center CT2 of the second heater element 232 overlap each other in the Z-direction. At this time, an outer peripheral edge 231e of the first heater element 231 and an outer peripheral edge 232e of the second heater element 232 overlap, for example, in the Z-direction.

FIG. 11 illustrates a positional relationship between a main zone 603 of FIG. 6 and a sub-zone 702e of FIG. 7. Herein, a case where the first main zone 610 is the main zone 603 and the first sub-zone 710 is the sub-zone 702e will be described as an example. The first main zone 610 is one of the main zones 600. The first sub-zone 710 is one of the sub-zones 700. The first sub-zone 710 overlaps the first main zone 610 in the Z-direction.

As illustrated in FIG. 11, the first sub-zone 710 has a central region 711 and an outer peripheral region 712. The central region 711 is located in the center of the first sub-zone 710 in a plan view. The outer peripheral region 712 is located outside the central region 711 in a plan view. For example, when the first sub-zone 710 is heated, the temperature of the central region 711 becomes higher than the temperature of the outer peripheral region 712.

In the example, the first sub-zone 710 is a region surrounded by an inner peripheral end 721, an outer peripheral end 722, a first side end 723, and a second side end 724. The inner peripheral end 721 overlaps the inner end portion of a sub-heater line 231c constituting the first sub-zone 710 in the radial direction Dr. The outer peripheral end 722 overlaps the outer end portion of the sub-heater line 231c constituting the first sub-zone 710 in the radial direction Dr. In the example, each of the inner peripheral end 721 and the outer peripheral end 722 has a circular arc shape.

The first side end 723 is located between one end of the inner peripheral end 721 and one end of the outer peripheral end 722. The first side end 723 overlaps one end portion of the sub-heater line 231c constituting the first sub-zone 710 in the circumferential direction Dc. The second side end 724 is located between the other end of the inner peripheral end 721 and the other end of the outer peripheral end 722. The second side end 724 overlaps the other end portion of the sub-heater line 231c constituting the first sub-zone 710 in the circumferential direction Dc. In the example, each of the first side end 723 and the second side end 724 has a linear shape.

The central region 711 has, for example, a center 715 of the first sub-zone 710. The center 715 is an intersection between a center line RL1 between the inner peripheral end 721 and the outer peripheral end 722 in the radial direction Dr and a center line CL1 between the first side end 723 and the second side end 724 in the circumferential direction Dc.

The central region 711 is a region between a center line RL2 between the inner peripheral end 721 and the center line RL1 in the radial direction Dr and a center line RL3 between the outer peripheral end 722 and the center line RL1 in the radial direction Dr and between a center line CL2 between the first side end 723 and the center line CL1 in the circumferential direction Dc and a center line CL3 between the second side end 724 and the center line CL1 in the circumferential direction Dc. That is, the central region 711 is inside the region surrounded by the center line RL2, the center line RL3, the center line CL2, and the center line CL3.

The outer peripheral region 712 is a region located outside (that is, the side opposite to the center line 715) the center line RL2, the center line RL3, the center line CL2, and the center line CL3. That is, the outer peripheral region 712 is located between the center line RL2 and the inner peripheral end 721, between the center line RL3 and the outer peripheral end 722, between the center line CL2 and the first side end 723, and between the center line CL3 and the second side end 724.

The first main zone 610 has a first main power feeding portion 232a, a second main power feeding portion 232b, and a main heater line 232c. The first main power feeding portion 232a is provided at a position where the first main power feeding portion 232a overlaps the central region 711 of the first sub-zone 710 in the Z-direction. In the example, the second main power feeding portion 232b is also provided at a position where the second main power feeding portion 232b overlaps the central region 711 in the Z-direction. The second main power feeding portion 232b may be provided at a position where the second main power feeding portion 232b does not overlap the central region 711 in the Z-direction. In addition, the second main power feeding portion 232b may be provided at a position where the second main power feeding portion 232b does not overlap the first sub-zone 710 in the Z-direction. In addition, in the example, the main heater line 232c is provided at a position where the main heater line 232c overlaps both the central region 711 and the outer peripheral region 712 of the first sub-zone 710 in the Z-direction. The main heater line 232c may be provided at a position where the main heater line 232c does not overlap the central region 711 in the Z-direction.

It is noted that, in the specification, the phrase "the first main power feeding portion 232a is provided at a position where the first main power feeding portion 232a overlaps the central region 711 of the first sub-zone 710 in the Z-direction" denotes that at least a portion of the first main power feeding portion 232a does overlap the central region 711 of the first sub-zone 710 in the Z-direction. That is, even when the first main power feeding portion 232a is provided at a position where the first main power feeding portion 232a overlaps the boundary between the central region 711 and the outer peripheral region 712 of the first sub-zone 710 in the Z-direction, the first main power feeding portion 232a is considered to be provided at a position where the first main power feeding portion 232a overlaps the central region 711 of the first sub-zone 710 in the Z-direction. In other words, when the first main power feeding portion 232a does not partially overlap the central region 711 of the first sub-zone 710 in the Z-direction, the first main power feeding portion 232a is considered to be provided at a position overlapping the outer peripheral region 712 of the first sub-zone 710 in the Z-direction. The same applies to the second main power feeding portion 232b and the main heater line 232c.

As described above, in the second heater element 232, the current flows to the main heater line 232c via the first main power feeding portion 232a and the second main power feeding portion 232b. Then, the main heater line 232c generates heat due to the flow of the current. When the second heater element 232 is heated, the temperature of the first main power feeding portion 232a and the second main power feeding portion 232b is likely to be lower than the temperature of the main heater line 232c.

In addition, the outer peripheral region 712 of the first sub-zone 710 is likely to have a lower heat generation density than the central region 711. Therefore, when the first heater element 231 is heated, the temperature of the outer peripheral region 712 is likely to be lower than the temperature of the central region 711. For this reason, when the first main power feeding portion 232a and the second main power feeding portion 232b are provided at positions overlapping the outer peripheral region 712 of the first sub-zone 710 in the Z-direction, there is a problem that the uniformity of the in-plane temperature distribution of the entire heater unit 200 deteriorates.

In contrast, according to the electrostatic chuck 10 according to the embodiment, the first main power feeding portion 232a of which temperature is likely to be lower than that of the main heater line 232c when the second heater element 232 is heated is provided at a position where the first main power feeding portion 232a overlaps the central region 711 of the first sub-zone 710 of which temperature is likely to be higher than that of the outer peripheral region 712 of the first sub-zone 710 in the Z-direction, so that the uniformity of the in-plane temperature distribution of the entire heater unit 200 can be improved. Accordingly, the uniformity of the in-plane temperature distribution of the process object W can be improved.

Figure 12:
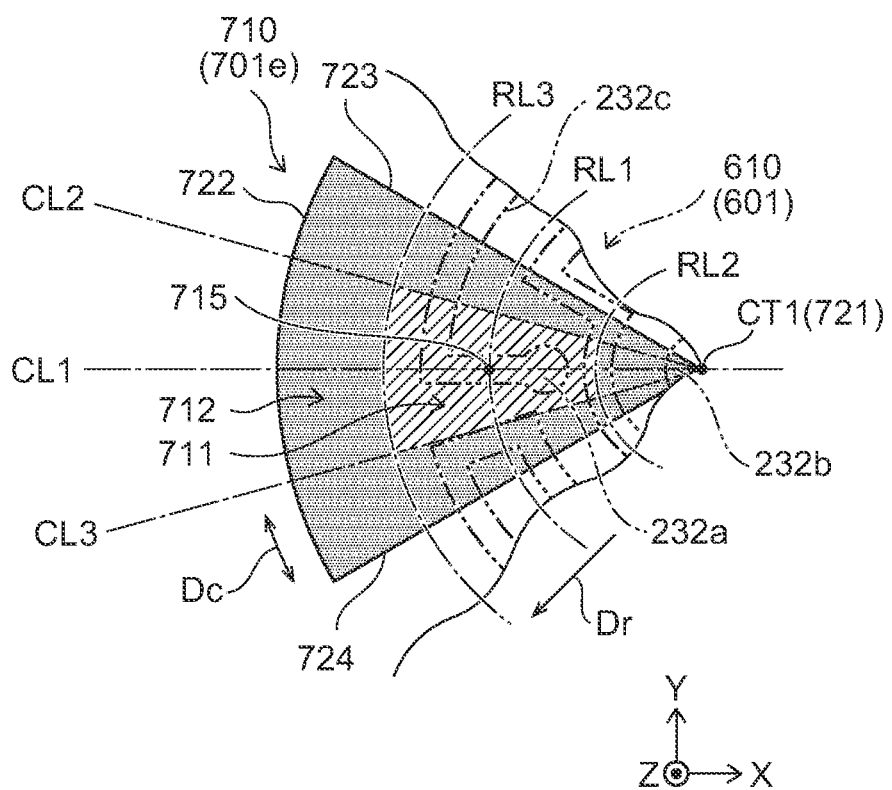
FIG. 12 is a plan view schematically illustrating positional relationship between another portion of the main zone of the second heater element and another portion of the sub-zone of the first heater element according to the first embodiment.

FIG. 12 is a plan view schematically illustrating positional relationship between another portion of the main zone of the second heater element and another portion of the sub-zone of the first heater element according to the first embodiment.

FIG. 12 illustrates positional relationship between a main zone 601 of FIG. 6 and a sub-zone 701e of FIG. 7. Herein, a case where the first main zone 610 is the main zone 601 and the first sub-zone 710 is the sub-zone 701e will be described as an example.

As illustrated in FIG. 12, in the example, the inner peripheral end 721 of the first sub-zone 710 is located near the center CT1 of the first heater element 231. The first sub-zone 710 is a substantially fan-shaped region surrounded by the outer peripheral end 722, the first side end 723, the second side end 724, and the inner peripheral end 721. The first sub-zone 710 (sub-zone 701e) illustrated in FIG. 12 is substantially the same as the first sub-zone 710 (sub-zone 702e) illustrated in FIG. 11 except that the shapes are different, and thus, the central region 711 and the outer peripheral region 712 will be omitted in description.

In addition, in the example, the first main power feeding portion 232a is provided at a position where the first main power feeding portion 232a overlaps the central region 711 of the first sub-zone 710 in the Z-direction. On the other hand, in the example, the second main power feeding portion 232b is provided at a position where the second main power feeding portion 232b does not overlap the central region 711 of the first sub-zone 710 in the Z-direction. The second main power feeding portion 232b may be provided at a position where the second main power feeding portion 232b overlaps the central region 711 of the first sub-zone 710 in the Z-direction.

Figure 13:
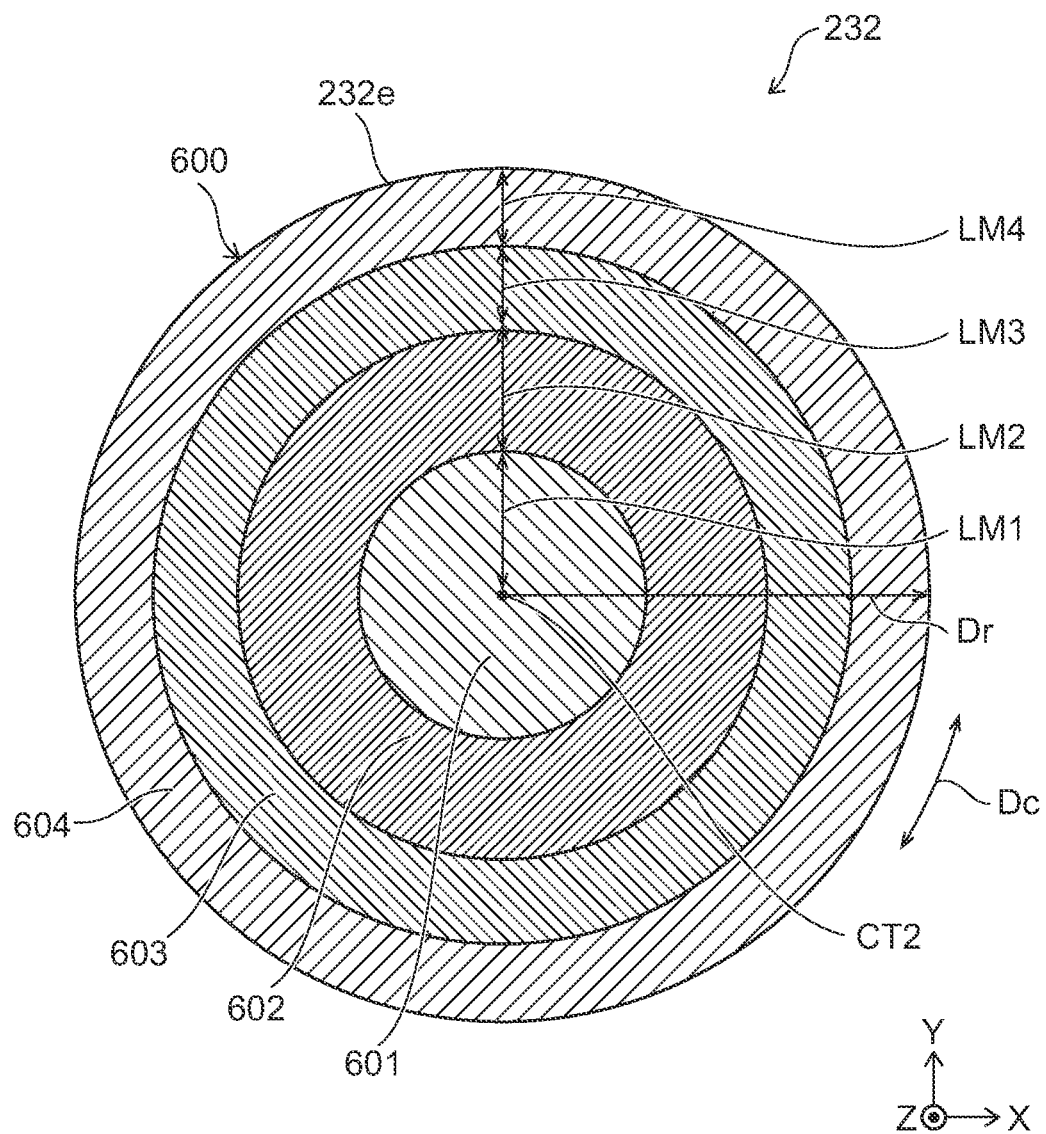
FIG. 13 is a plan view schematically illustrating the main zone of the second heater element according to the second embodiment.

FIG. 13 is a plan view schematically illustrating the main zone of the second heater element according to the second embodiment.

As illustrated in FIG. 13, in the example, the multiple main zones 600 of the second heater element 232 have the four main zones 601 to 604 aligned in the radial direction Dr. That is, the second heater element 232 is divided into four in the radial direction Dr. The main zones 600 are disposed in the order of the main zone 601, the main zone 602, the main zone 603, and the main zone 604 from the center CT2 of the second heater element 232 toward the outside in the radial direction Dr.

The main zone 601 has a circular shape centered on the center CT2 in a plan view. The main zone 602 has an annular shape located outside the main zone 601 and centered on the center CT2 in a plan view. The main zone 603 has an annular shape located outside the main zone 602 and centered on the center CT2 in a plan view. The main zone 604 has an annular shape located outside the main zone 603 and centered on the center CT2 in a plan view. In the example, a width LM1 of the main zone 601 in the radial direction Dr, a width LM2 of the main zone 602 in the radial direction Dr, a width LM3 of the main zone 603 in the radial direction Dr, and a width LM4 of the main zone 604 in the radial direction Dr are different from each other.

Figure 14:
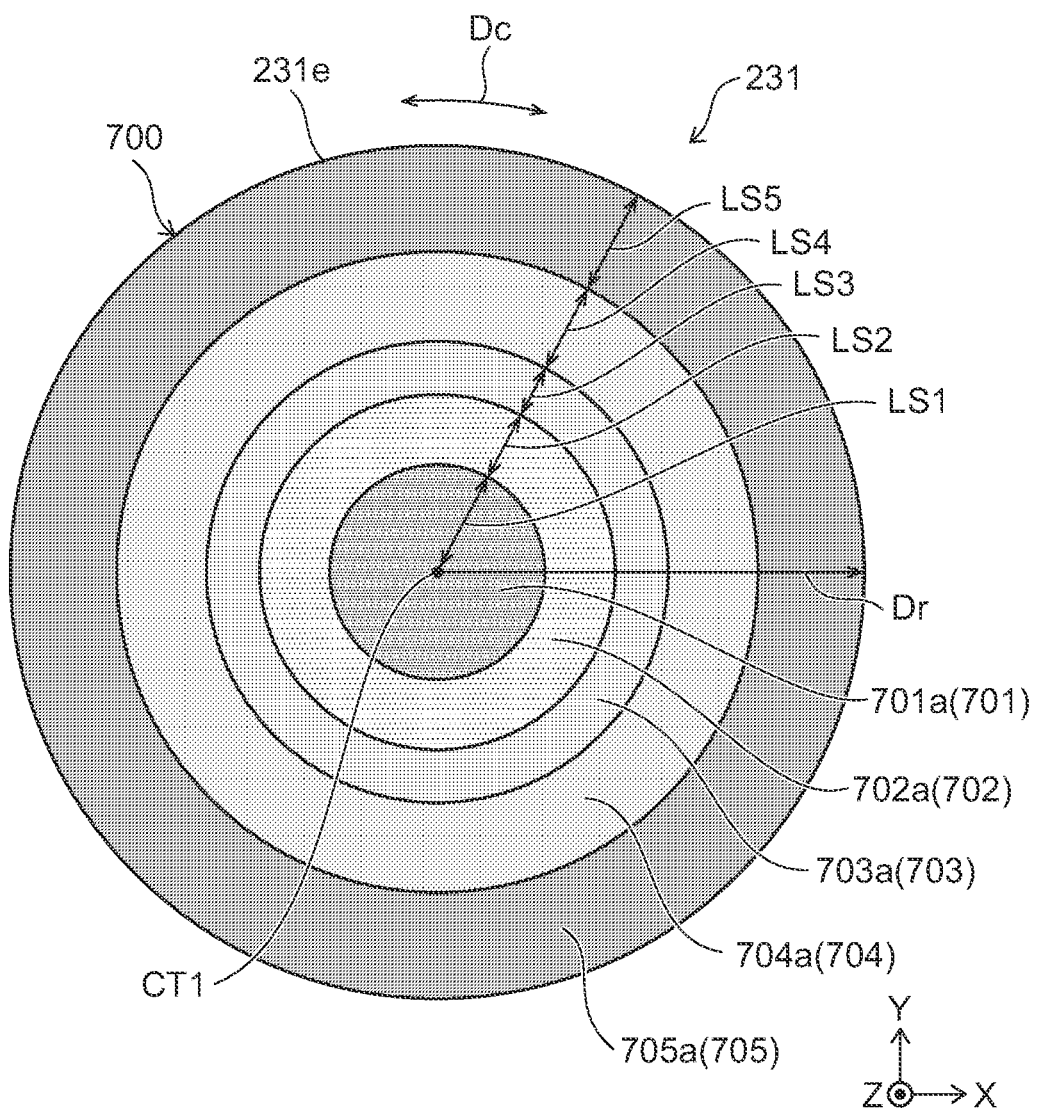
FIG. 14 is a plan view schematically illustrating a sub-zone of the first heater element according to the second embodiment.

FIG. 14 is a plan view schematically illustrating a sub-zone of the first heater element according to the second embodiment.

As illustrated in FIG. 14, in the example, the multiple sub-zones 700 of the first heater element 231 have a first region 701 configured with sub-zones 701a, a second region 702 configured with sub-zones 702a, a third region 703 configured with sub-zones 703a, a fourth region 704 configured with sub-zones 704a, and a fifth region 705 configured with sub-zones 705a. That is, the second heater element 232 is divided into five regions in the radial direction Dr. In the example, each of the first region 701, the second region 702, the third region 703, the fourth region 704, and the fifth region 705 is not divided in the circumferential direction Dc. The regions are disposed in the order of the first region 701, the second region 702, the third region 703, the fourth region 704, and the fifth region 705 from the center CT1 of the first heater element 231 toward the outside in the radial direction Dr.

The first region 701 has a circular shape centered on the center CT1 in a plan view. The second region 702 has an annular shape located outside the first region 701 and centered on the center CT1 in a plan view. The third region 703 has an annular shape located outside the second region 702 and centered on the center CT1 in a plan view. The fourth region 704 has an annular shape located outside the third region 703 and centered on the center CT1 in a plan view. The fifth region 705 has an annular shape located outside the fourth region 704 and centered on the center CT1 in a plan view.

In the example, a width LS1 of the first region 701 in the radial direction Dr, a width LS2 of the second region 702 in the radial direction Dr, a width LS3 of the third region 703 in the radial direction Dr, a width LS4 of the fourth region 704 in the radial direction Dr, and a width LS5 of the fifth region 705 in the radial direction Dr are different from each other.

Figure 15:
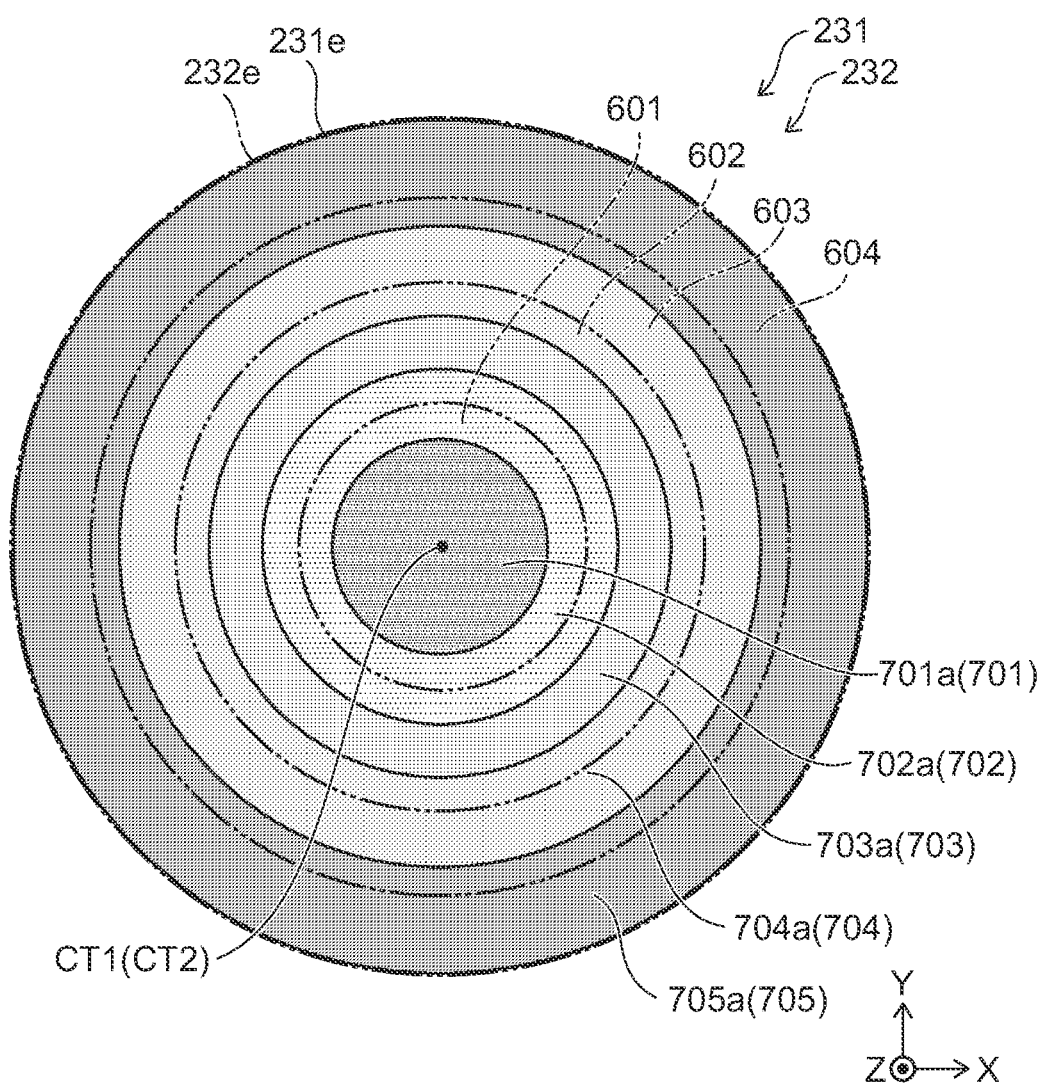
FIG. 15 is a plan view schematically illustrating a positional relationship between the main zone of the second heater element and the sub-zone of the first heater element according to the second embodiment.

FIG. 15 is a plan view schematically illustrating a positional relationship between the main zone of the second heater element and the sub-zone of the first heater element according to the second embodiment.

Figure 16:
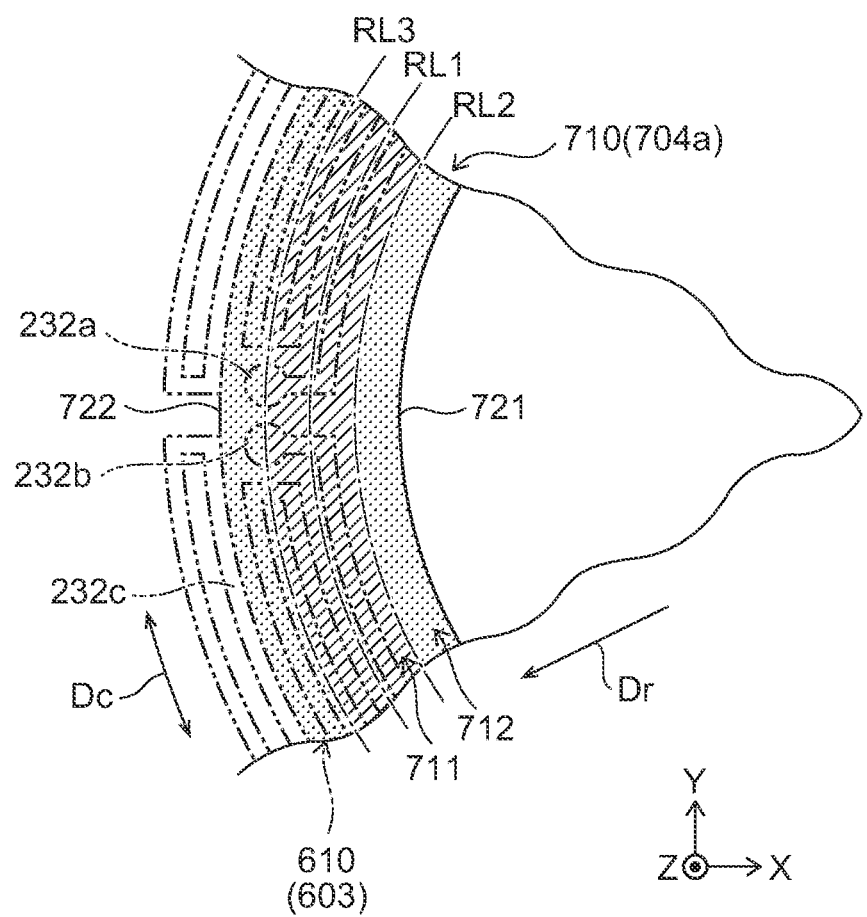
FIG. 16 is a plan view schematically illustrating a positional relationship between a portion of the main zone of the second heater element and a portion of the sub-zone of the first heater element according to the second embodiment.

FIG. 16 is a plan view schematically illustrating a positional relationship between a portion of the main zone of the second heater element and a portion of the sub-zone of the first heater element according to the second embodiment.

FIG. 16 illustrates a positional relationship between the main zone 603 of FIG. 13 and the sub-zone 704a of FIG. 14. Herein, a case where the first main zone 610 is the main zone 603 and the first sub-zone 710 is the sub-zone 704a will be described as an example.

As illustrated in FIG. 16, in the example, the first sub-zone 710 is not divided in the circumferential direction Dc. That is, the first sub-zone 710 does not have the first side end 723 and the second side end 724. In other words, the first sub-zone 710 is an annular region surrounded by the inner peripheral end 721 and the outer peripheral end 722.

In the example, the central region 711 of the first sub-zone 710 is a region between the center line RL2 between the inner peripheral end 721 and the center line RL1 in the radial direction Dr and the center line RL3 between the outer peripheral end 722 and the center line RL1 in the radial direction Dr. That is, the central region 711 is inside the region surrounded by the center line RL2 and the center line RL3. The center line RL1 is a center line between the inner peripheral end 721 and the outer peripheral end 722 in the radial direction Dr.

In the example, the outer peripheral region 712 of the first sub-zone 710 is located between the center line RL2 and the inner peripheral end 721, and between the center line RL3 and the outer peripheral end 722.

In addition, in the example, the first main power feeding portion 232a is provided at a position where the first main power feeding portion 232a overlaps the central region 711 of the first sub-zone 710 in the Z-direction. In addition, also in the example, the second main power feeding portion 232b is provided at a position where the second main power feeding portion 232b overlaps the central region 711 of the first sub-zone 710 in the Z-direction. The second main power feeding portion 232b may be provided at a position where the second main power feeding portion 232b does not overlap the central region 711 of the first sub-zone 710 in the Z-direction. In addition, the second main power feeding portion 232b may be provided at a position where the second main power feeding portion 232b does not overlap the first sub-zone 710 in the Z-direction.

Figure 17:
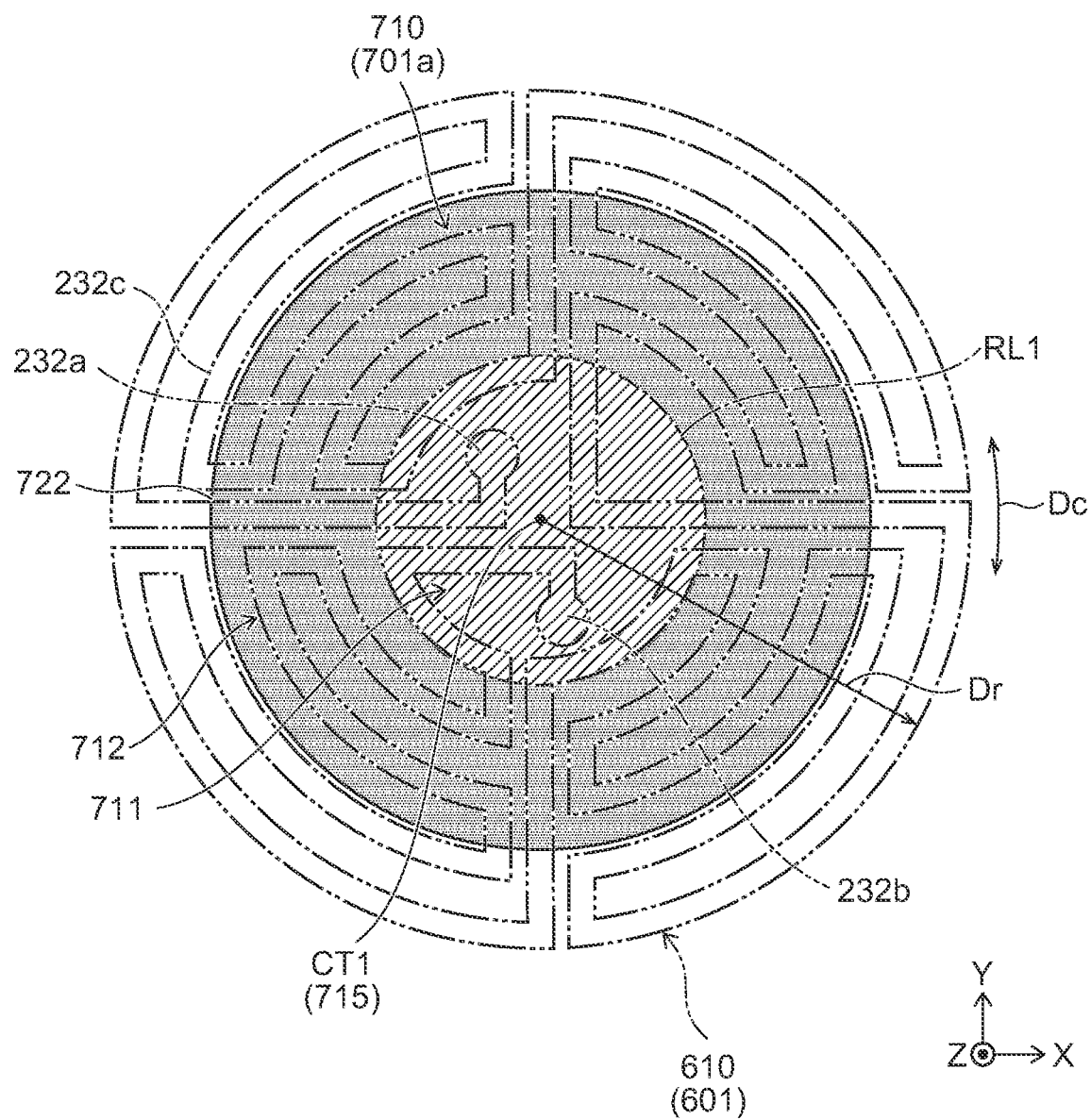
FIG. 17 is a plan view schematically illustrating a positional relationship between another portion of the main zone of the second heater element and another portion of the sub-zone of the first heater element according to the second embodiment.

FIG. 17 is a plan view schematically illustrating a positional relationship between another portion of the main zone of the second heater element and another portion of the sub-zone of the first heater element according to the second embodiment.

FIG. 17 illustrates a positional relationship between the main zone 601 of FIG. 13 and the sub-zone 701a of FIG. 14. Herein, a case where the first main zone 610 is the main zone 601 and the first sub-zone 710 is the sub-zone 701a will be described as an example.

As illustrated in FIG. 17, in the example, the first sub-zone 710 is a circular region centered on the center CT1 of the first heater element 231 and surrounded by the outer peripheral end 722. That is, the first sub-zone 710 does not have the inner peripheral end 721, the first side end 723, and the second side end 724. In addition, the center 715 of the first sub-zone 710 coincides with the center CT1 of the first heater element 231.

In the example, the central region 711 of the first sub-zone 710 is inside the region surrounded by the center line RL1 between the center 715 and the outer peripheral end 722 of the first sub-zone 710 in the radial direction Dr. That is, the central region 711 is a concentric circle of the first sub-zone 710 and is a circular region having a radius half that of the first sub-zone 710.

In the example, the outer peripheral region 712 of the first sub-zone 710 is a region located outside (that is, on the side opposite to the center 715) the center line RL1. That is, the outer peripheral region 712 is located between the center line RL1 and the outer peripheral end 722.

In addition, in the example, the first main power feeding portion 232a is provided at a position where the first main power feeding portion 232a overlaps the central region 711 of the first sub-zone 710 in the Z-direction. In addition, also in the example, the second main power feeding portion 232b is provided at a position where the second main power feeding portion 232b overlaps the central region 711 of the first sub-zone 710 in the Z-direction. The second main power feeding portion 232b may be provided at a position where the second main power feeding portion 232b does not overlap the central region 711 of the first sub-zone 710 in the Z-direction. In addition, the second main power feeding portion 232b may be provided at a position where the second main power feeding portion 232b does not overlap the first sub-zone 710 in the Z-direction.

Figure 18:
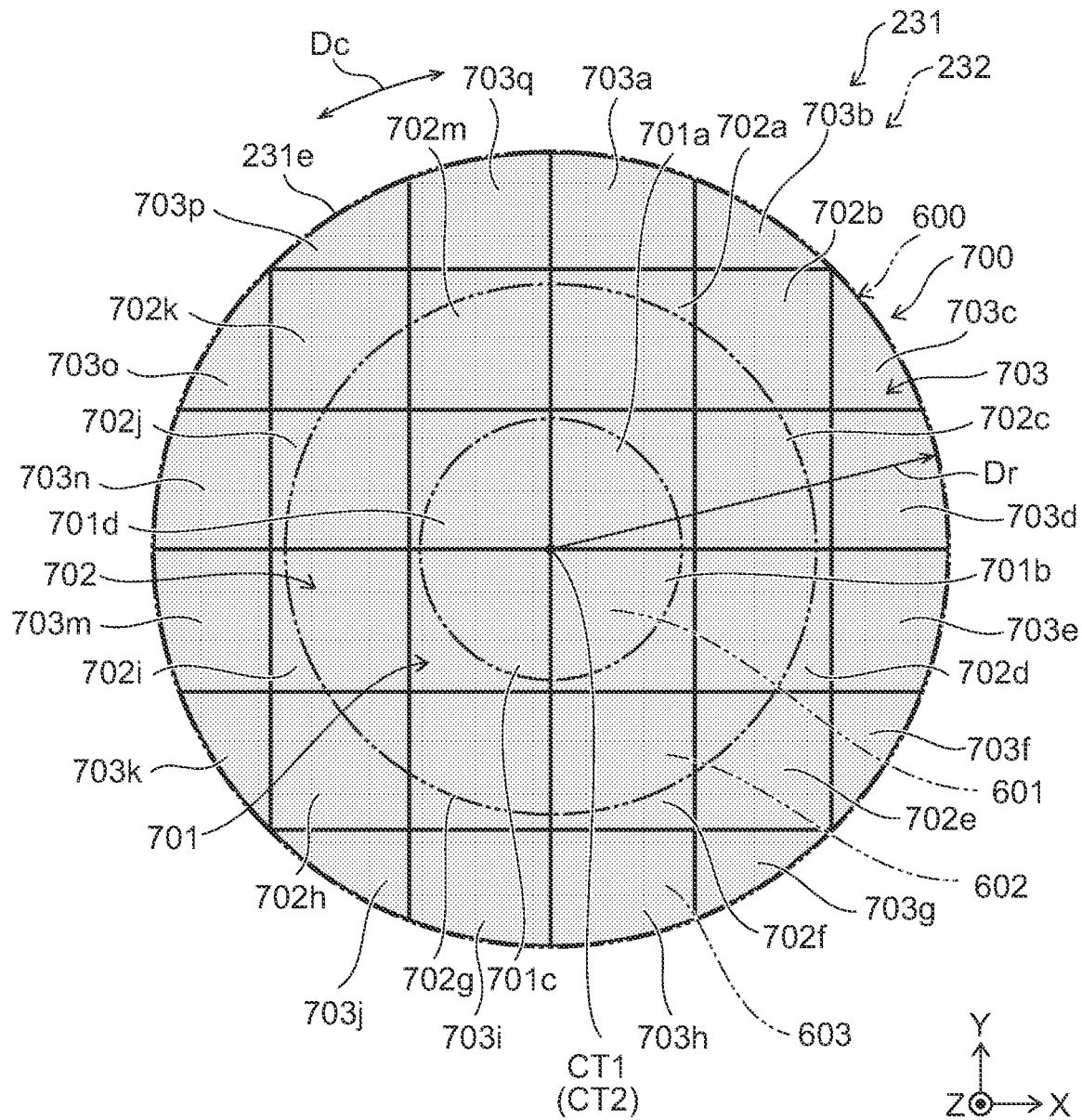
FIG. 18 is a plan view schematically illustrating a positional relationship between the main zone of the second heater element and the sub-zone of the first heater element according to the third embodiment.

FIG. 18 is a plan view schematically illustrating a positional relationship between the main zone of the second heater element and the sub-zone of the first heater element according to the third embodiment.

As illustrated in FIG. 18, in the example, the first heater element 231 is divided in a grid pattern. The multiple sub-zones 700 of the first heater element 231 have the first region 701 configured with sub-zones 701a to 701d, the second region 702 configured with sub-zones 702a to 702m, and the third region 703 configured with sub-zones 703a to 703q. The regions are disposed in the order of the first region 701, the second region 702, and the third region 703 from the center CT1 of the first heater element 231 toward the outside in the radial direction Dr.

Each of the sub-zones 701a to 701d and the sub-zones 702a to 702m has a rectangular shape in a plan view.

Figure 19:
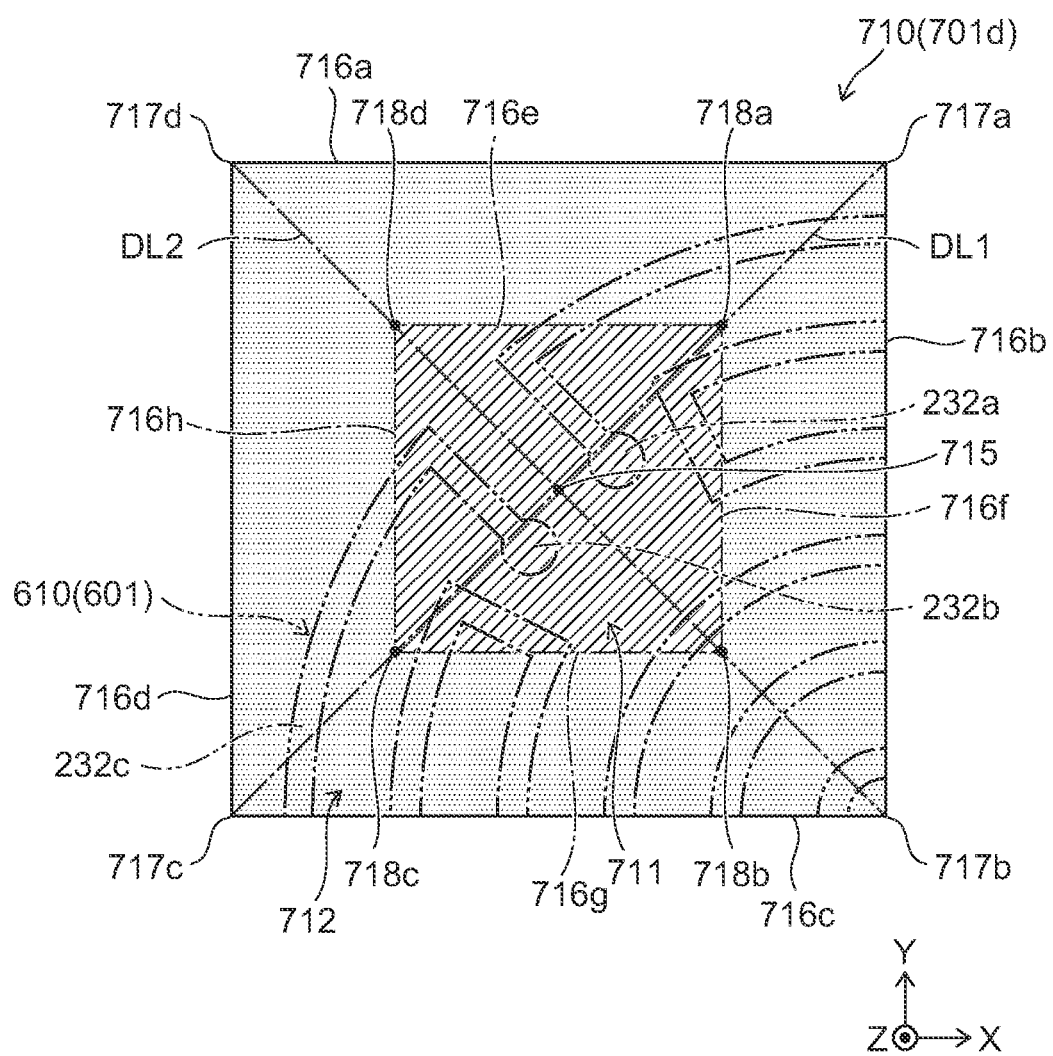
FIG. 19 is a plan view schematically illustrating a portion of the sub-zone of the first heater element according to the third embodiment.

FIG. 19 is a plan view schematically illustrating a portion of the sub-zone of the first heater element according to the third embodiment.

In FIG. 19, a portion of the sub-zone 701a of FIG. 15 is illustrated in an enlarged manner. Herein, a case where the first sub-zone 710 is the sub-zone 701d will be described as an example.

As illustrated in FIG. 19, in the example, the first sub-zone 710 is a rectangular region surrounded by a first side 716a, a second side 716b, a third side 716c, and a fourth side 716d. The first sub-zone 710 has a first corner 717a formed of the first side 716a and the second side 716b, a second corner 717b formed of the second side 716b and the third side 716c, a third corner 717c formed of the third side 716c and the fourth side 716d, and a fourth corner 717d formed of the fourth side 716d and the first side 716a.

The central region 711 of the first sub-zone 710 has, for example, the center 715 of the first sub-zone 710. The center 715 is an intersection of a diagonal line DL1 connecting the first corner 717a and the third corner 717c and a diagonal line DL2 connecting the second corner 717b and the fourth corner 717d.

In the example, the central region 711 is inside of a region connecting a first midpoint 718a which is the midpoint between the center 715 and the first corner 717a, a second midpoint 718b which is the midpoint between the center 715 and the second corner 717b, a third midpoint 718c which is the midpoint between the center 715 and the third corner 717c, and a fourth midpoint 718d which is the midpoint between the center 715 and the fourth corner 717d. That is, the central region 711 is inside a region surrounded by a fifth side 716e connecting the fourth midpoint 718d and the first midpoint 718a, a sixth side 716f connecting the first midpoint 718a and the second midpoint 718b, a seventh side 716g connecting the second midpoint 718b and the third midpoint 718c, and an eighth side 716h connecting the third midpoint 718c and the fourth midpoint 718d.

In the example, the outer peripheral region 712 is a region located outside (that is, the side opposite to the center 715) the fifth side 716e, the sixth side 716f, the seventh side 716g, and the eighth side 716h. That is, the outer peripheral region 712 is located between the first side 716a and the fifth side 716e, between the second side 716b and the sixth side 716f, between the third side 716c and the seventh side 716g, and between the fourth side 716d and the eighth side 716h.

In addition, in the example, the first main power feeding portion 232a is provided at a position where the first main power feeding portion 232a overlaps the central region 711 of the first sub-zone 710 in the Z-direction. In addition, also in the example, the second main power feeding portion 232b is provided at a position where the second main power feeding portion 232b overlaps the central region 711 of the first sub-zone 710 in the Z-direction. The second main power feeding portion 232b may be provided at a position where the second main power feeding portion 232b does not overlap the central region 711 of the first sub-zone 710 in the Z-direction. In addition, the second main power feeding portion 232b may be provided at a position where the second main power feeding portion 232b does not overlap the first sub-zone 710 in the Z-direction.

Figure 20:
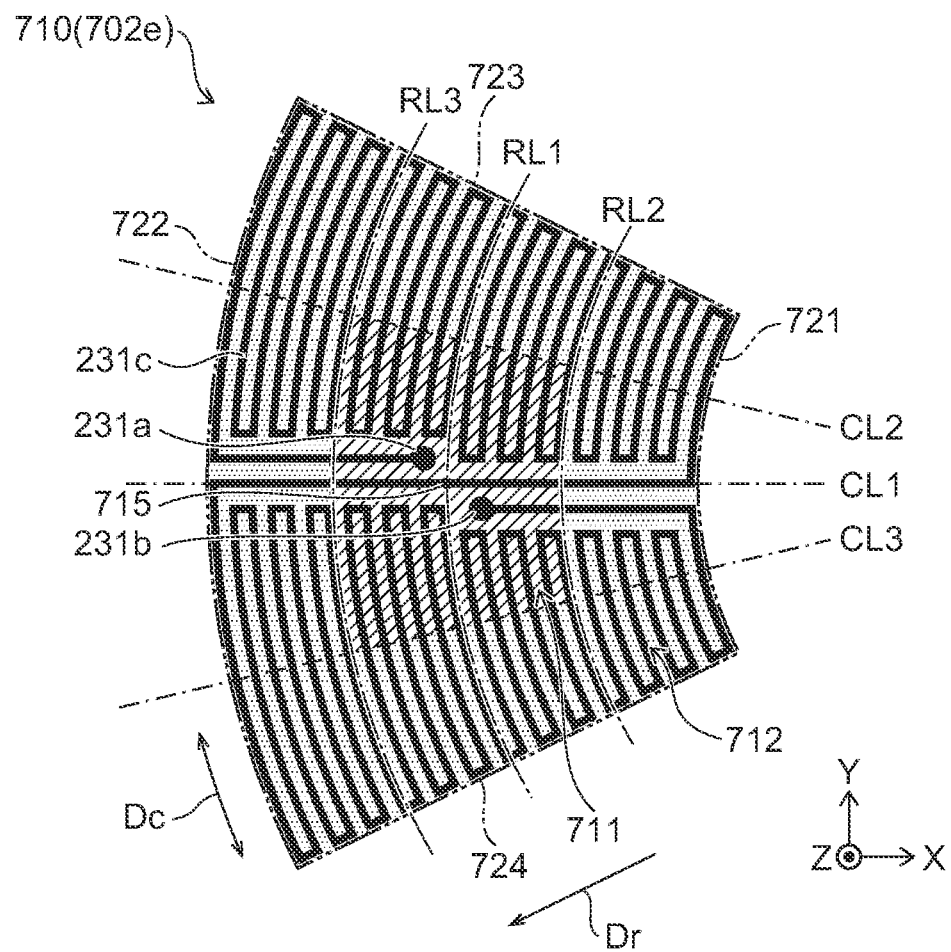
FIG. 20 is a plan view schematically illustrating a portion of the sub-zone of the first heater element according to the first embodiment.

FIG. 20 is a plan view schematically illustrating a portion of the sub-zone of the first heater element according to the first embodiment.

In FIG. 20, the sub-zone 702e of FIG. 7 is illustrated in an enlarged manner. Herein, a case where the first sub-zone 710 is the sub-zone 702e will be described as an example.

As illustrated in FIG. 20, the first sub-zone 710 has a first sub-power feeding portion 231a, a second sub-power feeding portion 231b, and a sub-heater line 231c. At least one of the first sub-power feeding portion 231a and the second sub-power feeding portion 231b is provided in the central region 711. In the example, both the first sub-power feeding portion 231a and the second sub-power feeding portion 231b are provided in the central region 711. Any of the first sub-power feeding portion 231a and the second sub-power feeding portion 231b may be provided in the outer peripheral region 712. In addition, in the example, the sub-heater line 231c is provided in both the central region 711 and the outer peripheral region 712.

It is noted that, in the specification, the phrase "the first sub-power feeding portion 231a is provided in the central region 711" denotes that at least a portion of the first sub-power feeding portion 231a overlaps the central region 711 in the Z-direction. The same applies to the second sub-power feeding portion 231b and the sub-heater line 231c.

Similarly to the second heater element 232, when the first heater element 231 is heated, the temperature of the first sub-power feeding portion 231a and the temperature of the second sub-power feeding portion 231b are likely to be lower than the temperature of the sub-heater line 231c. Therefore, in this manner, the first sub-power feeding portion 231a and the second sub-power feeding portion 231b of which temperature is likely to be lower than that of the sub-heater line 231c are provided in the central region 711 of which temperature is likely to be higher than that of the outer peripheral region 712, so that the uniformity of the in-plane temperature distribution of the first sub-zone 710 can be improved. Accordingly, the uniformity of the in-plane temperature distribution of the entire heater unit 200 can be further improved.

In addition, since both the first sub-power feeding portion 231a and the second sub-power feeding portion 231b are provided in the central region 711, the uniformity of the in-plane temperature distribution of the first sub-zone 710 can be further improved. Accordingly, the uniformity of the in-plane temperature distribution of the entire heater unit 200 can be further improved.

Figure 21:
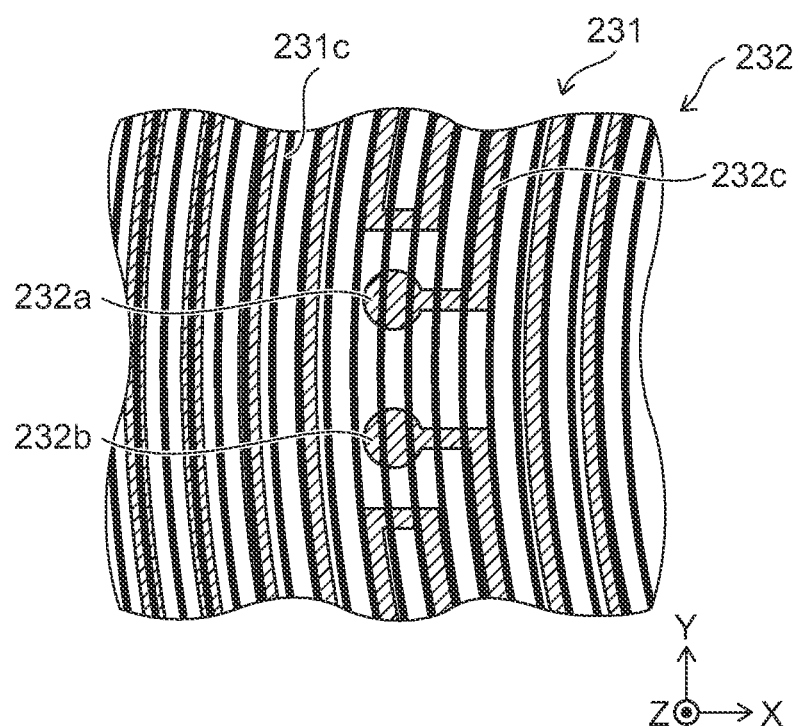
FIG. 21 is a plan view schematically illustrating a positional relationship between the sub-heater line of the first heater element and the first main power feeding portion of the second heater element according to the embodiment.

FIG. 21 is a plan view schematically illustrating a positional relationship between the sub-heater line of the first heater element and the first main power feeding portion of the second heater element according to the embodiment.

As illustrated in FIG. 21, the second heater element 232 is provided so as to overlap the first heater element 231 in the Z-direction. In the example, the second heater element 232 is provided below the first heater element 231.

The first main power feeding portion 232*a* of the second heater element 232 is provided, for example, at a position where the first main power feeding portion 232*a* overlaps the sub-heater line 231*c* of the first heater element 231 in the Z-direction. In addition, the main heater line 232*c* of the second heater element 232 is provided, for example, at a position where the main heater line 232*c* overlaps the sub-heater line 231*c* of the first heater element 231 in the Z-direction. That is, the sub-heater line 231*c* of the first heater element 231 is provided, for example, above the first main power feeding portion 232*a* and the main heater line 232*c* of the second heater element 232.

Since the first main power feeding portion 232*a* is provided at a position where the first main power feeding portion 232*a* overlaps the sub-heater line 231*c* in the Z-direction in this manner, the low temperature of the first main power feeding portion 232*a* can be supplemented by the heat of the sub-heater line 231*c*, and the uniformity of the in-plane temperature distribution of the entire heater unit 200 can be further improved.

Figure 22:
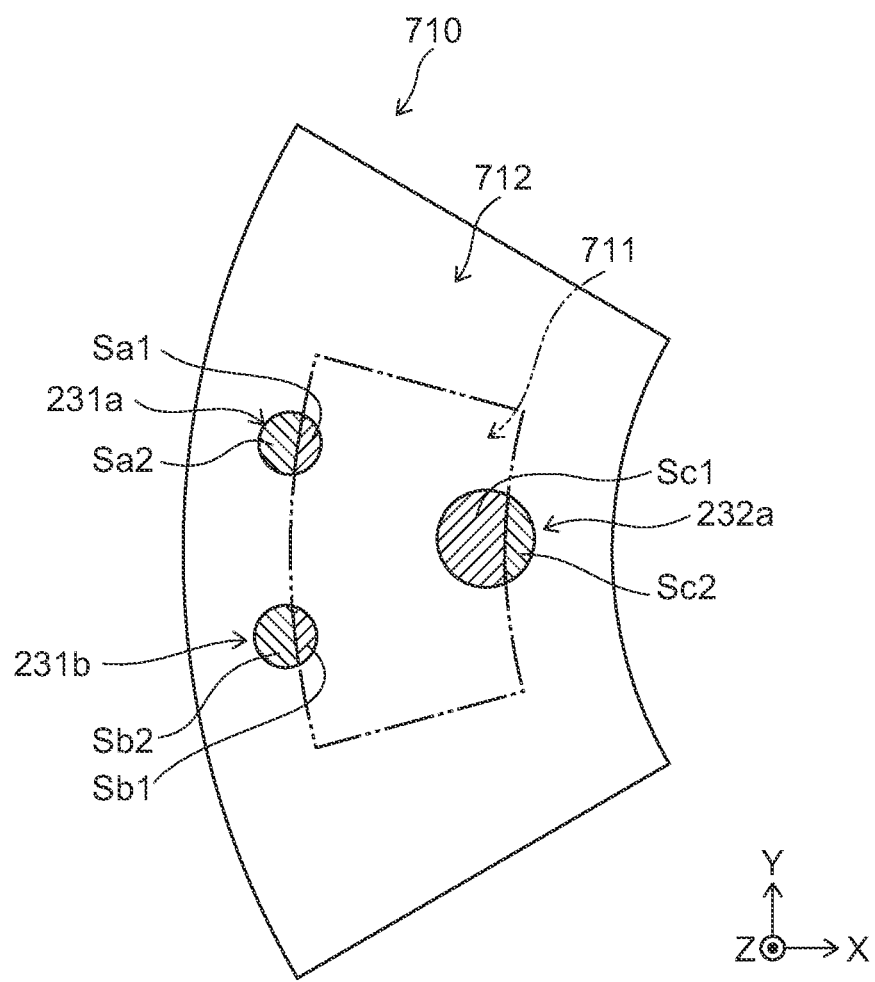
FIG. 22 is a plan view schematically illustrating a positional relationship between a portion of the main zone of the second heater element and a portion of the sub-zone of the first heater element according to a variation of the first embodiment.

FIG. 22 is a plan view schematically illustrating a positional relationship between a portion of the main zone of the second heater element and a portion of the sub-zone of the first heater element according to a variation of the first embodiment.

As illustrated in FIG. 22, in the example, the first sub-power feeding portion 231*a* is provided at a position where a portion of the first sub-power feeding portion 231*a* overlaps the central region 711 and another portion of the first sub-power feeding portion 231*a* overlaps the outer peripheral region 712. In addition, the second sub-power feeding portion 231*b* is provided at a position where a portion of the second sub-power feeding portion 231*b* overlaps the central region 711 and another portion of the second sub-power feeding portion 231*b* overlaps the outer peripheral region 712. In addition, the first main power feeding portion 232*a* is provided at a position where a portion of the first main power feeding portion 232*a* overlaps the central region 711 and another portion of the first main power feeding portion 232*a* overlaps the outer peripheral region 712.

Herein, the area of the first sub-power feeding portion 231*a* overlapping the central region 711 is set as Sa1, and the area of the first sub-power feeding portion 231*a* overlapping the outer peripheral region 712 is set as Sa2. The area Sa of the first sub-power feeding portion 231*a* in a plan view is represented by Sa=Sa1+Sa2. The area Sa1 may be zero. That is, the first sub-power feeding portion 231*a* may not overlap the central region 711. Alternatively, the area Sa2 may be zero. That is, the first sub-power feeding portion 231*a* may not overlap the outer peripheral region 712.

Similarly, the area of the second sub-power feeding portion 231*b* overlapping the central region 711 is set as Sb1, and the area of the second sub-power feeding portion 231*b* overlapping the outer peripheral region 712 is set as Sb2. The area Sb of the second sub-power feeding portion 231*b* in a plan view is represented by Sb=Sb1+Sb2. The area Sb1 may be zero. That is, the second sub-power feeding portion 231*b* may not overlap the central region 711. Alternatively, the area Sb2 may be zero. That is, the second sub-power feeding portion 231*b* may not overlap the outer peripheral region 712.

Similarly, the area of the first main power feeding portion 232*a* overlapping the central region 711 is set as Sc1, and the area of the first main power feeding portion 232*a* overlapping the outer peripheral region 712 is set as Sc2. The area Sc in the plan view of the first main power feeding portion 232*a* is represented by Sc=Sc1+Sc2. The area Sc1 is greater than zero. That is, at least a portion of the first main power feeding portion 232*a* overlaps the central region 711. The area Sc2 may be zero. That is, the first main power feeding portion 232*a* may not overlap the outer peripheral region 712.

For example, it is favorable that the sum of the area Sa1, the area Sb1 and the area Sc1 (S1=Sa1+Sb1+Sc1) is larger than the sum of the area Sa1, the area Sb2 and the area Sc2 (S2=Sa2+Sb2+Sc2) (S1>S2). In other words, the total area of the power feeding portions overlapping the central region 711 is favorably larger than the total area of the power feeding portions overlapping the outer peripheral region 712.

In this manner, the total area of the power feeding portions overlapping the central region 711 is allowed to be larger than the total area of the power feeding portions overlapping the outer peripheral region 712, so that the power feeding portion of which temperature is likely to be low can be brought to be closer to the central region 711 of which temperature is relatively high in the zone. Accordingly, the uniformity of the in-plane temperature distribution of the entire heater unit 200 can be further improved.

The area Sc is, for example, larger than the area Sa and larger than the area Sb (Sc>Sa, Sc>Sb). In addition, the area Sc is, for example, larger than the sum of the area Sa and the area Sb (Sc>Sa+Sb). The area Sa is, for example, equal to the area Sb (Sa=Sb).

Figure 23:
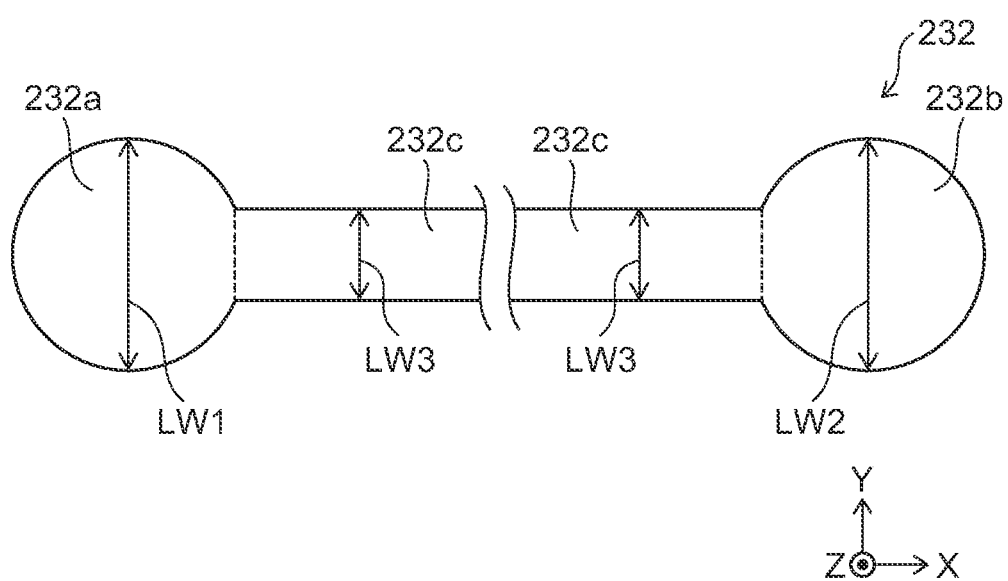
FIG. 23 is a plan view schematically illustrating a portion of the second heater element according to the embodiment.

FIG. 23 is a plan view schematically illustrating a portion of the second heater element according to the embodiment.

As illustrated in FIG. 23, in the second heater element 232, the first main power feeding portion 232*a* is provided at one end of the main heater line 232*c*. In addition, the second main power feeding portion 232*b* is provided at the other end of the main heater line 232*c*.

The "power feeding portion" is a portion that is provided at the start point and the end point of the heater line and electrically connected to the power feeding terminal 280. The power feeding portion itself does not generate heat. The power feeding portion and the power feeding terminal 280 may be physically connected to each other, or the power feeding portion and the bypass layer 250 may be physically connected to each other by, for example, welding or soldering, and the bypass layer 250 and the power feeding terminal 280 may be physically connected to each other.

In a plan view, a width LW1 of the first main power feeding portion 232*a* is larger than a width LW3 of the main heater line 232*c*. That is, at the end portion of the main heater line 232*c*, the portion having the width LW1 larger than the width LW3 of the main heater line 232*c* is the first main power feeding portion 232*a*. Herein, the "width" is the maximum length in the direction orthogonal to the direction in which the main heater line 232*c* extends from the connection portion between the first main power feeding portion 232*a* and the main heater line 232*c*. It is noted that, when the direction in which the main heater line 232*c* extends from the connection portion is on a curve, the "width" is the maximum length in the direction orthogonal to the tangential direction of the curve.

Similarly, in a plan view, a width LW2 of the second main power feeding portion 232b is larger than the width LW3 of the main heater line 232c. That is, at the end portion of the main heater line 232c, the portion having the width LW2 larger than the width LW3 of the main heater line 232c is the second main power feeding portion 232b. Herein, the "width" is the maximum length in the direction orthogonal to the direction in which the main heater line 232c extends from the connection portion between the second main power feeding portion 232b and the main heater line 232c. It is noted that, when the direction in which the main heater line 232c extends from the connection portion is on a curve, the "width" is the maximum length in the direction orthogonal to the tangential direction of the curve.

It is noted that, in the example, the shapes of the first main power feeding portion 232a and the second main power feeding portion 232b in a plan view are circular shapes. The shapes of the first main power feeding portion 232a and the second main power feeding portion 232b in a plan view are not limited to a circular shape, and may be an elliptical shape, a polygonal shape, or the like.

For example, when the second heater element 232 is heated, the temperature of the first main power feeding portion 232a and the temperature of the second main power feeding portion 232b become lower than the temperature of the main heater line 232c. That is, the generated heat amount of the first main power feeding portion 232a and the generated heat amount of the second main power feeding portion 232b are smaller than the generated heat amount of the main heater line 232c.

In addition, the first sub-power feeding portion 231a, the second sub-power feeding portion 231b, and the sub-heater line 231c of the first heater element 231 are also the same as the first main power feeding portion 232a, the second main power feeding portion 232b, and the main heater line 232c of the second heater element 232. That is, in a plan view, the width of the first sub-power feeding portion 231a is larger than the width of the sub-heater line 231c. In addition, in a plan view, the width of the second sub-power feeding portion 231b is larger than the width of the sub-heater line 231c. In addition, the shape of the first sub-power feeding portion 231a and the second sub-power feeding portion 231b in a plan view may be a circular shape, an elliptical shape, a polygonal shape, or the like.

For example, when the first heater element 231 is heated, the temperature of the first sub-power feeding portion 231a and the temperature of the second sub-power feeding portion 231b become lower than the temperature of the sub-heater line 231c. That is, the generated heat amount of the first sub-power feeding portion 231a and the generated heat amount of the second sub-power feeding portion 231b are smaller than the generated heat amount of the sub-heater line 231c.

Figure 24:
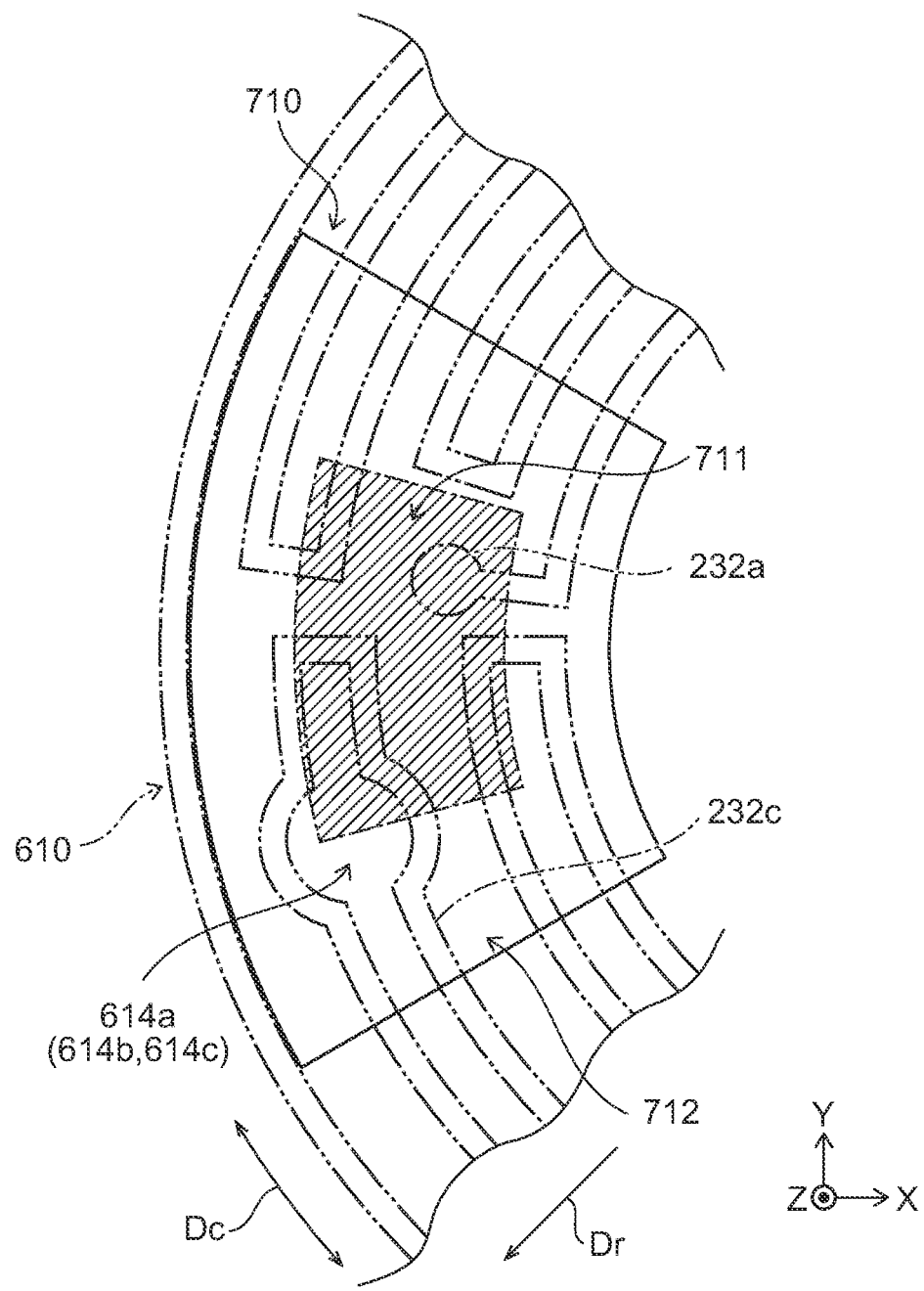
FIG. 24 is a plan view schematically illustrating a positional relationship between a portion of the main zone of the second heater element and a portion of the sub-zone of the first heater element according to a variation of the first embodiment.

FIG. 24 is a plan view schematically illustrating a positional relationship between a portion of the main zone of the second heater element and a portion of the sub-zone of the first heater element according to a variation of the first embodiment.

As illustrated in FIG. 24, the first main zone 610 may have a lift pin hole 614a provided so that a lift pin (not illustrated) for supporting the process object W can pass through. In the lift pin hole 614a, the main heater line 232c is curved so as to bypass a portion where the lift pin is provided. The lift pin hole 614a is provided, for example, at a position where the lift pin hole 614a overlaps the central region 711 of the first sub-zone 710 in the Z-direction. It is noted that the lift pin hole 614a may be provided, for example, at a position where the lift pin hole 614a does not overlap the central region 711 of the first sub-zone 710 in the Z-direction. In addition, the lift pin hole 614a is provided as needed and can be omitted.

In addition, the first main zone 610 may have a clamping electrode terminal hole 614b provided so that a clamping electrode terminal (not illustrated) for supplying the current to the clamping electrode (electrode layer 111) can pass through the clamping electrode terminal hole 614b. In the clamping electrode terminal hole 614b, the main heater line 232c is curved so as to bypass a portion where the clamping electrode terminal is provided. The clamping electrode terminal hole 614b is provided, for example, at a position where the clamping electrode terminal hole 614b overlaps the central region 711 of the first sub-zone 710 in the Z-direction. It is noted that the clamping electrode terminal hole 614b may be provided, for example, at a position where the clamping electrode terminal hole 614b does not overlap the central region 711 of the first sub-zone 710 in the Z-direction. In addition, the clamping electrode terminal hole 614b is provided as needed and can be omitted.

In addition, the first main zone 610 may have a cooling gas hole 614c provided so that a cooling gas for cooling the process object W can pass through the cooling gas hole 614c. The cooling gas hole 614c constitutes, for example, a portion of the introduction path 321. In the cooling gas hole 614c, the main heater line 232c is curved so as to bypass a portion through which the cooling gas passes. The cooling gas hole 614c is provided, for example, at a position where the cooling gas hole 614c overlaps the central region 711 of the first sub-zone 710 in the Z-direction. It is noted that the cooling gas hole 614c may be provided, for example, at a position where the cooling gas hole 614c does not overlap the central region 711 of the first sub-zone 710 in the Z-direction. In addition, the cooling gas hole 614c is provided as needed and can be omitted.

It is noted that, in the specification, the phrase "the lift pin hole 614a is provided at a position where the lift pin hole 614a overlaps the central region 711 of the first sub-zone 710 in the Z-direction" denotes that at least a portion of the lift pin hole 614a does overlap the central region 711 in the Z-direction. The same applies to the clamping electrode terminal hole 614b and the cooling gas hole 614c.

In this manner, the lift pin hole 614a, the clamping electrode terminal hole 614b, and the cooling gas hole 614c of which temperature is likely to be lower than those of other portions, when the second heater element 232 is heated, since the main heater line 232c is not provided are provided at a position where the lift pin hole 614a, the clamping electrode terminal hole 614b, and the cooling gas hole 614c overlap the central region 711 of the first sub-zone 710 in the Z-direction, of which the temperature is likely to be higher than that of the outer peripheral region 712 of the first sub-zone 710, so that the uniformity of the in-plane temperature distribution of the entire heater unit 200 can be improved.

It is noted that the first main zone 610 may have any one of the lift pin hole 614a, the clamping electrode terminal hole 614b, and the cooling gas hole 614c, may have two or more of the holes, or may have three of the holes. In addition, each of the number of the lift pin holes 614a, the clamping electrode terminal holes 614b, and the cooling gas holes 614c provided in the first main zone 610 may be one or may be two or more.

Figure 25:
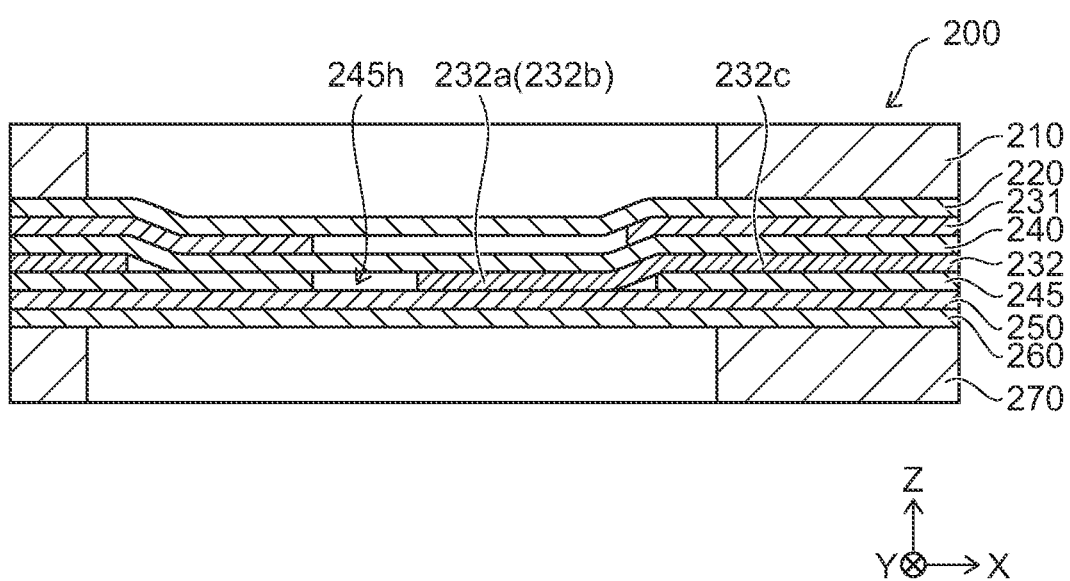
FIG. 25 is a cross-sectional view schematically illustrating a portion of the heater unit according to the embodiment.

FIG. 25 is a cross-sectional view schematically illustrating a portion of the heater unit according to the embodiment.

As illustrated in FIG. 25, in the example, the second heater element 232 is provided between the bypass layer 250 and the first heater element 231 in the Z-direction. In addition, a second insulating layer 240 is provided between the first heater element 231 and the second heater element 232. In addition, a third insulating layer 245 is provided between the second heater element 232 and the bypass layer 250.

The third insulating layer 245 has a hole part 245h piercing in the Z-direction. The second heater element 232 is electrically connected to the bypass layer 250 in the hole part 245h. That is, the bypass layer 250 is electrically connected to the first main power feeding portion 232a by being in direct contact with the first main power feeding portion 232a in the hole part 245h.

The hole part 245h is provided, so that, even when the third insulating layer 245 is provided between the bypass layer 250 and the second heater element 232, the bypass layer 250 and the second heater element 232 (first main power feeding portion 232a) can be in direct contact with each other. In addition, the bypass layer 250 is allowed to be in direct contact with the first main power feeding portion 232a and is allowed to be electrically connected to the first main power feeding portion 232a, so that the degree of freedom in arranging the power feeding terminal 280 can be increased in comparison with a case where the power feeding terminal 280 and the power feeding portion (first main power feeding portion 232a and second main power feeding portion 232b) are directly connected.

Figure 26:
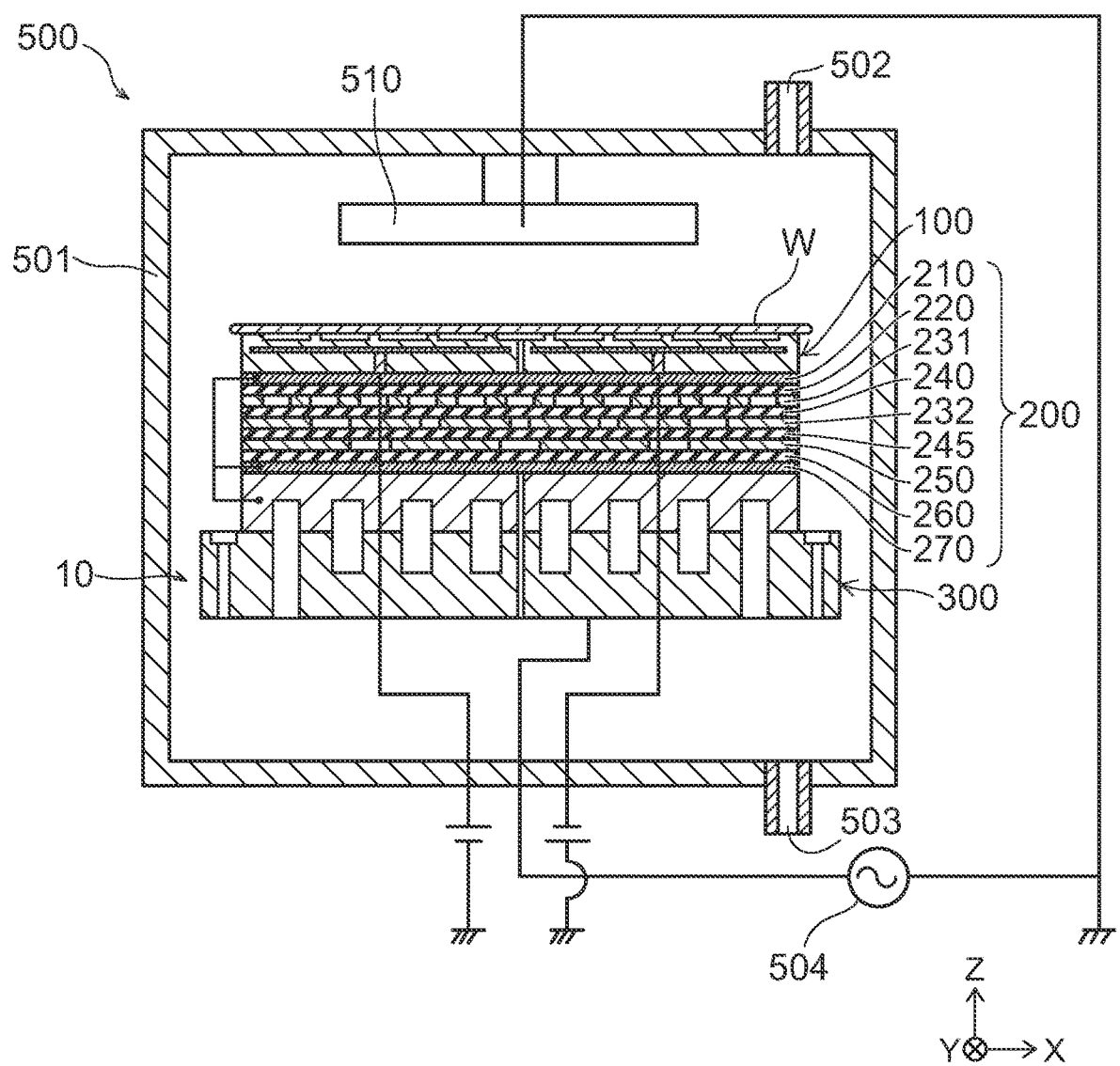
FIG. 26 is a cross-sectional view schematically illustrating the wafer processing apparatus according to the embodiment.

FIG. 26 is a cross-sectional view schematically illustrating the wafer processing apparatus according to the embodiment.

As illustrated in FIG. 26, a wafer processing apparatus 500 according to the embodiment includes a processing container 501, an upper electrode 510, and an electrostatic chuck 10. A process gas introduction port 502 for introducing the process gas into the inside is provided on the ceiling of the processing container 501. An exhaust port 503 for depressurizing and exhausting the inside is provided on the bottom plate of the processing container 501. In addition, a high frequency power supply 504 is connected to the upper electrode 510 and the electrostatic chuck 10, and a pair of electrodes having the upper electrode 510 and the electrostatic chuck 10 face each other in parallel at a predetermined interval.

In the wafer processing apparatus 500, when a high frequency voltage is applied between the upper electrode 510 and the electrostatic chuck 10, high frequency discharge occurs and the process gas introduced into the processing container 501 is excited and activated by plasma, and thus, the process object W will be processed. It is noted that, as the process object W, a semiconductor substrate (wafer) can be exemplified. However, the process object W is not limited to the semiconductor substrate (wafer), and may be, for example, a glass substrate used in a liquid crystal display device or the like.

The high frequency power supply 504 is electrically connected to the base plate 300 of the electrostatic chuck 10. As described above, a metal material such as aluminum is used for the base plate 300. That is, the base plate 300 has a conductive property. Accordingly, the high frequency voltage is applied between an upper electrode 510 and the base plate 300.

In addition, in the example, the base plate 300 is electrically connected to the first support plate 210 and the second support plate 270. Accordingly, in the wafer processing apparatus 500, a high frequency voltage is applied between the first support plate 210 and the upper electrode 510, and also between the second support plate 270 and the upper electrode 510.

In this manner, a high frequency voltage is applied between each of the support plates 210 and 270 and the upper electrode 510. Accordingly, in comparison with a case where the high frequency voltage is applied only between the base plate 300 and the upper electrode 510, the place where the high frequency voltage is applied can be allowed to be closer to the process object W. Accordingly, for example, plasma can be generated more efficiently at a low potential.

An apparatus having a configuration such as the wafer processing apparatus 500 is generally called a parallel plate type reactive ion etching (RIE) apparatus, but the electrostatic chuck 10 according to the embodiment is not limited to an application to the apparatus. For example, the electrostatic chuck 10 according to the embodiment can be widely adapted to a so-called decompression processing apparatus such as an electron cyclotron resonance (ECR) etching apparatus, an inductively coupled plasma processing apparatus, a helicon wave plasma processing apparatus, a plasma separation type plasma processing apparatus, a surface wave plasma processing apparatus, and a plasma chemical vapor deposition (CVD) apparatus. Such a wafer processing apparatus 500 is used, for example, in the manufacturing of a semiconductor device. The wafer processing apparatus 500 is used, for example, as a semiconductor manufacturing apparatus.

In addition, the electrostatic chuck 10 according to the embodiment can be widely applied to a substrate processing device such as an exposure device or an inspection device in which processing or inspection is performed under atmospheric pressure. However, considering the high plasma resistance of the electrostatic chuck 10 according to the embodiment, it is favorable that the electrostatic chuck 10 is applied to the plasma processing apparatus. It is noted that, since a known configuration can be applied to a portion other than the electrostatic chuck 10 according to the embodiment among the configurations of the apparatus, the description thereof will be omitted.

In this manner, the wafer processing apparatus is allowed to include the electrostatic chuck 10 where the first main power feeding portion 232a of which temperature is likely to be lower than that of the main heater line 232c when the second heater element 232 is heated is provided at a position where the first main power feeding portion 232a overlaps the central region 711 of the first sub-zone 710 in the Z-direction, of which temperature is likely to be higher than that of the outer peripheral region 712 of the first sub-zone 710, so that the uniformity of the in-plane temperature distribution of the entire heater unit 200 can be improved. Accordingly, the uniformity of the in-plane temperature distribution of the process object W can be improved.

Figure 27:
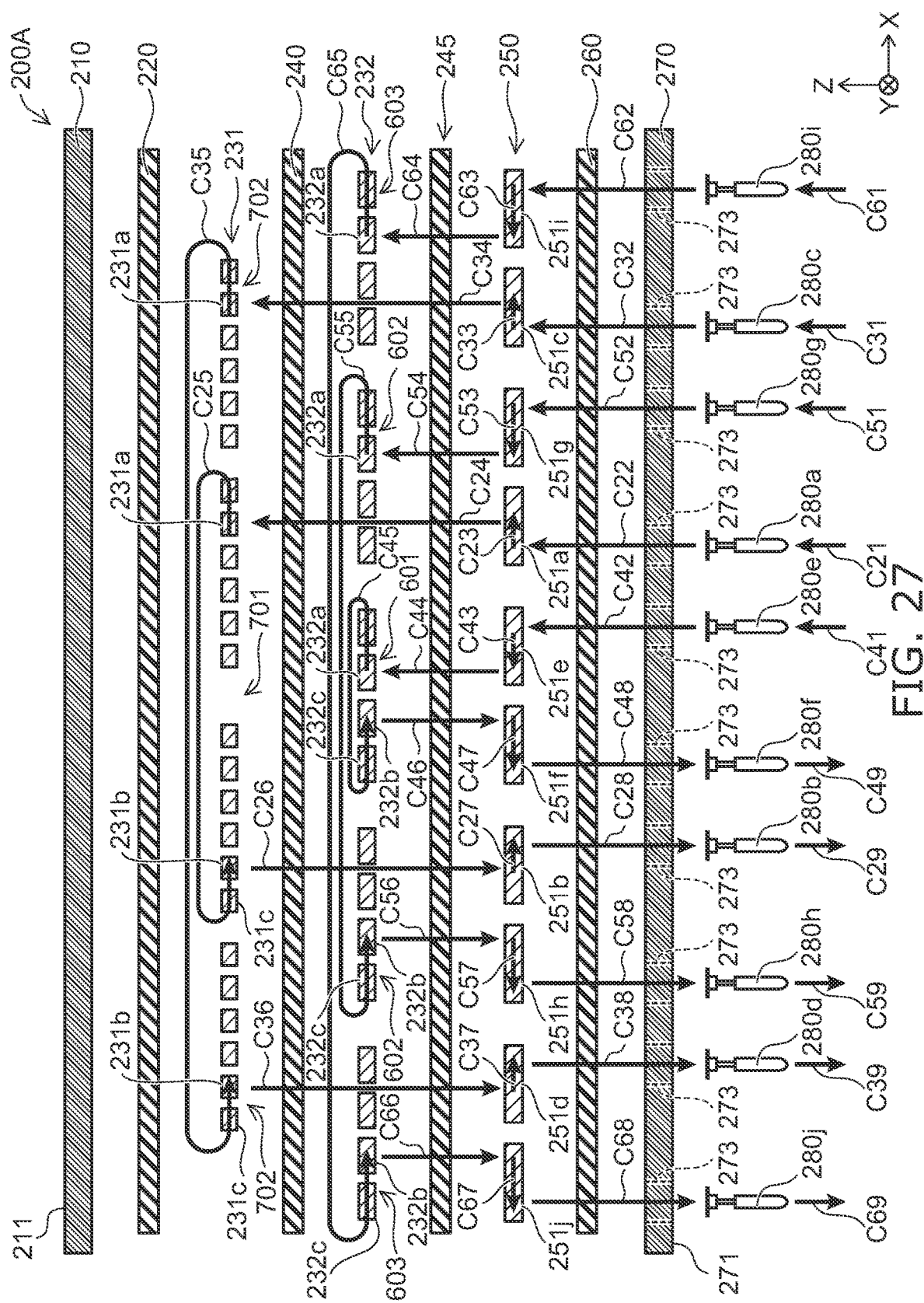
FIG. 27 is an exploded cross-sectional view schematically illustrating a heater unit according to a variation of the embodiment.

FIG. 27 is an exploded cross-sectional view schematically illustrating a heater unit according to a variation of the embodiment.

As illustrated in FIG. 27, a heater unit 200A according to the variation of the embodiment is different from the heater unit 200 illustrated in FIG. 5 in that independent temperature control is performed in each of the sub-zones (region) 700 of the first heater element 231, and independent temperature control is performed in each of the main zones 600 of the second heater element 232. It is noted that the same configuration as the heater unit 200 illustrated in FIG. 5 will be omitted in description.

In the example, ten power feeding terminals 280a to 280j are provided as the power feeding terminals 280. In addition, in the example, the bypass layer 250 has ten bypass portions 251a to 251j.

The first heater element 231 has the first region 701 and the second region 702. Each of the first region 701 and the second region 702 has the first sub-power feeding portion 231a, the second sub-power feeding portion 231b, and the sub-heater line 231c.

The second heater element 232 has the main zone 601, the main zone 602, and the main zone 603. Each of the main zones 601 to 603 has the first main power feeding portion 232a, the second main power feeding portion 232b, and the main heater line 232c.

When power is supplied from the outside of the electrostatic chuck 10 to the power feeding terminal 280a as indicated by arrows C21 and C22, the current flows from the power feeding terminal 280a to the bypass portion 251a. As indicated by arrows C23 and C24, the current flowing to the bypass portion 251a flows from the bypass portion 251a to the first region 701 of the first heater element 231. As indicated by arrows C25 and C26, the current flowing to the first region 701 flows from the first region 701 to the bypass portion 251b. More specifically, the current flowing to the bypass portion 251a flows to the sub-heater line 231c of the first region 701 via the first sub-power feeding portion 231a of the first region 701 and flows to the bypass portion 251b via the second sub-power feeding portion 231b of the first region 701. As indicated by arrows C27 and C28, the current flowing to the bypass portion 251b flows from the bypass portion 251b to the power feeding terminal 280b. As indicated by an arrow C29, the current flowing to the power feeding terminal 280b flows to the outside of the electrostatic chuck 10.

Similarly, when power is supplied from the outside of the electrostatic chuck 10 to the power feeding terminal 280c, the current flows in the order of the power feeding terminal 280c, the bypass portion 251c, the second region 702 of the first heater element 231, the bypass portion 251d, and the power feeding terminal 280d as indicated by arrows C31 to C39.

Similarly, when power is supplied to the power feeding terminal 280e from the outside of the electrostatic chuck 10, the current flows in the order of the power feeding terminal 280e, the bypass portion 251e, the main zone 601 of the second heater element 232, the bypass portion 251f, and the power feeding terminal 280f as indicated by arrows C41 to C49.

Similarly, when power is supplied to the power feeding terminal 280g from the outside of the electrostatic chuck 10, the current flows in the order of the power feeding terminal 280g, the bypass portion 251g, the main zone 602 of the second heater element 232, the bypass portion 251h, and the power feeding terminal 280h as indicated by arrows C51 to C59.

Similarly, when power is supplied to the power feeding terminal 280i from the outside of the electrostatic chuck 10, the current flows in the order of the power feeding terminal 280i, the bypass portion 251i, the main zone 603 of the second heater element 232, the bypass portion 251j, and the power feeding terminal 280j as indicated by arrows C61 to C69.

For example, the voltage applied to the power feeding terminal 280a and the voltage applied to the power feeding terminal 280c are allowed to be different from each other, so that the output of the first region 701 and the output of the second region 702 can be allowed to be different from each other. That is, the outputs of the sub-zones (regions) 700 can be controlled independently.

For example, the voltage applied to the power feeding terminal 280e, the voltage applied to the power feeding terminal 280g, and the voltage applied to the power feeding terminal 280i are allowed to be different from one another, so that the output of the main zone 601, the output of the main zone 602, and the output of the main zone 603 can be allowed to be different from one another. That is, the outputs of the main zones 600 can be controlled independently.

As described above, according to the embodiment, there is provided an electrostatic chuck and a semiconductor manufacturing apparatus capable of improving the uniformity of the in-plane temperature distribution of the process object.

The invention has been described with reference to the embodiments. However, the invention is not limited to these embodiments. Any design changes in the above embodiments suitably made by those skilled in the art are also encompassed within the scope of the invention as long as they fall within the spirit of the invention. For example, the shape, the size the material, the disposition and the arrangement or the like of the components included in the electrostatic chuck are not limited to illustrations and can be changed appropriately.

The components included in the embodiments described above can be combined to the extent possible, and these combinations are also encompassed within the scope of the invention as long as they include the features of the invention.

What is claimed is:
1. An electrostatic chuck comprising:
a ceramic dielectric substrate having a first major surface configured to have a process object mounted thereon and a second major surface opposite to the first major surface;
a base plate supporting the ceramic dielectric substrate; and
a heater unit which heats the ceramic dielectric substrate, wherein
the heater unit includes a first heater element and a second heater element,
the second heater element having a plurality of main zones separated from each other in a radial direction,
the first heater element having a plurality of sub-zones separated from each other,
a number of the sub-zones being larger than a number of the main zones,
the main zones including a first main zone,
the first main zone having a main heater line generating heat by allowing a current to flow and a first main power feeding portion feeding a power to the main heater line,
the sub-zones including a first sub-zone overlapping the first main zone in a Z-direction perpendicular to the first major surface,
the first sub-zone having a central region located centrally in the first sub-zone and an outer peripheral region located outside the central region when viewed along the Z-direction,
the first sub-zone being a region surrounded by an inner peripheral end, an outer peripheral end, a first side end, and a second side end, the inner peripheral end being located at an inner end portion in the radial direction, the outer peripheral end being located at an outer end portion in the radial direction, the first side end being located at a one-side end portion in the circumferential direction, the second side end being located at an other-side end portion in the circumferential direction, the central region being a region surrounded by a second radial center line, a third radial center line, a second circumferential center line, and a third circumferential center line, the second radial center line being a center line between a first radial center line and the inner peripheral end in the radial direction, the first radial center line being a center line between the inner peripheral end and the outer peripheral end in the radial direction, the third radial center line being a center line between the first radial center line and the outer peripheral end in the radial direction, the second circumferential center line being a center line between a first circumferential center line and the first side end in the circumferential direction, the first circumferential center line being a center line between the first side end and the second side end in the circumferential direction, the third circumferential center line being a center line between the first circumferential center line and the second side end in the circumferential direction, and the first main power feeding portion being provided at a position where the first main power feeding portion overlaps the central region in the Z-direction.

2. The chuck according to claim 1, wherein the first sub-zone has a sub-heater line generating heat by allowing a current to flow, a first sub-power feeding portion feeding a power to the sub-heater line, and a second sub-power feeding portion feeding a power to the sub-heater line, and when viewed along the Z-direction, a sum of an area of the first sub-power feeding portion overlapping the central region, an area of the second sub-power feeding portion overlapping the central region, and an area of the first main power feeding portion overlapping the central region is larger than a sum of an area of the first sub-power feeding portion overlapping the outer peripheral region, an area of the second sub-power feeding portion overlapping the outer peripheral region, and an area of the first main power feeding portion overlapping the outer peripheral region.

3. The chuck according to claim 1, wherein the first sub-zone has a sub-heater line generating heat by allowing the current to flow, a first sub-power feeding portion feeding a power to the sub-heater line, and a second sub-power feeding portion feeding a power to the sub-heater line, and at least one of the first sub-power feeding portion and the second sub-power feeding portion is provided in the central region.

4. The chuck according to claim 3, wherein the first sub-power feeding portion and the second sub-power feeding portion are provided in the central region.

5. The chuck according to claim 1, wherein the first sub-zone has a sub-heater line generating heat by allowing the current to flow, a first sub-power feeding portion feeding a power to the sub-heater line, and a second sub-power feeding portion feeding a power to the sub-heater line, and the first main power feeding portion is provided at a position where the first main power feeding portion overlaps the sub-heater line in the Z-direction.

6. The chuck according to claim 1, wherein the first main zone further has a lift pin hole provided with a lift pin for supporting the process object being able to passing through the lift pin hole, and the lift pin hole is provided at a position where the lift pin hole overlaps the central region in the Z-direction.

7. The chuck according to claim 1, further comprising a clamping electrode provided inside the ceramic dielectric substrate, the first main zone further having a clamping electrode terminal hole provided with a clamping electrode terminal for supplying a current to the clamping electrode being able to pass through the clamping electrode terminal hole, and the clamping electrode terminal hole being provided at a position where the clamping electrode terminal hole overlaps the central region in the Z-direction.

8. The chuck according to claim 1, wherein the first main zone further has a cooling gas hole provided with a cooling gas for cooling the process object being able to pass though the cooling gas hole, and the cooling gas hole is provided at a position where the cooling gas hole overlaps the central region in the Z-direction.

9. The chuck according to claim 1, wherein the heater unit further has a bypass layer as a power feeding path to the first heater element and the second heater element, and the bypass layer is electrically connected to the first main power feeding portion by being in direct contact with the first main power feeding portion.

10. The chuck according to claim 9, wherein the second heater element is provided between the bypass layer and the first heater element in the Z-direction.

11. The chuck according to claim 1, wherein the first heater element generates less heat than the second heater element.

12. The chuck according to claim 1, wherein a volume resistivity of the first heater element is higher than a volume resistivity of the second heater element.

13. The chuck according to claim 1, wherein the heater unit is provided between the ceramic dielectric substrate and the base plate.

14. The chuck according to claim 1, wherein the heater unit is provided within the ceramic dielectric substrate between the first major surface and the second major surface.

15. A semiconductor manufacturing apparatus comprising the electrostatic chuck according to claim 1.

* * * * *